United States Patent
Wu et al.

(10) Patent No.: US 8,867,286 B2
(45) Date of Patent: Oct. 21, 2014

(54) REPAIRABLE MULTI-LAYER MEMORY CHIP STACK AND METHOD THEREOF

(75) Inventors: Ming-Hsueh Wu, Kaohsiung (TW); Kun-Lun Luo, Hsinchu (TW); Chen-An Chen, Kaohsiung (TW); Yee-Wen Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 308 days.

(21) Appl. No.: 13/533,977

(22) Filed: Jun. 27, 2012

(65) Prior Publication Data
US 2013/0155794 A1    Jun. 20, 2013

(30) Foreign Application Priority Data

Dec. 20, 2011 (TW) .............................. 100147476 A

(51) Int. Cl.
*G11C 7/00* (2006.01)

(52) U.S. Cl.
USPC .. 365/200; 365/201; 365/189.08; 365/230.05

(58) Field of Classification Search
CPC ........ G11C 5/02; G11C 29/808; G11C 29/04; G11C 29/883; G11C 7/1048; G11C 7/1051; G11C 7/1057; G11C 7/1078; G11C 7/1084
USPC ............. 365/189.03, 189.05, 189.07, 189.08, 365/200, 201, 230.05, 230.08
See application file for complete search history.

(56) References Cited

U.S. PATENT DOCUMENTS

| | | |
|---|---|---|
| 7,222,271 B2 | 5/2007 | Ruckerbauer et al. |
| 7,796,446 B2 | 9/2010 | Ruckerbauer et al. |
| 7,835,207 B2 | 11/2010 | Keeth et al. |
| 7,936,622 B2 | 5/2011 | Li et al. |
| 2002/0188897 A1 | 12/2002 | Ruckerbauer et al. |
| 2004/0165467 A1* | 8/2004 | Sasaki et al. ................ 365/225.7 |
| 2004/0264282 A1* | 12/2004 | Penney .................... 365/230.06 |
| 2009/0168569 A1 | 7/2009 | Ryu |
| 2009/0180339 A1 | 7/2009 | Kim et al. |
| 2010/0078829 A1 | 4/2010 | Hargan |
| 2010/0085825 A1 | 4/2010 | Keeth et al. |
| 2010/0110745 A1 | 5/2010 | Jeddeloh et al. |

(Continued)

OTHER PUBLICATIONS

Koh et al., "The Salvage Cache: A fault-tolerant cache architecture for next-generation memory technologies", ICCD, 2009, p. 268-p. 274.

(Continued)

*Primary Examiner* — Hien Nguyen
(74) *Attorney, Agent, or Firm* — Jianq Chyun IP Office

(57) ABSTRACT

A repairable multi-layer memory chip stack wherein each of the memory chips of the chip stack includes a control unit, a decoding unit, a memory array module and a redundant repair unit comprising at least one redundant repair element. The decoding unit receives a memory address from an address bus, and correspondingly outputs a decoded address. The memory array module determines whether to allow a data bus to access the data of the memory array module corresponding to a decoded address in accordance with an activation signal of the control unit. The redundant repair element includes a valid field, a chip ID field, a faulty address field and a redundant memory. When the valid field is valid, the value of the chip ID field matches the ID code, and the value of the faulty address field matches the decoded address, the redundant memory is coupled to the data bus.

17 Claims, 9 Drawing Sheets

(56) References Cited

U.S. PATENT DOCUMENTS

| | | |
|---|---|---|
| 2010/0121994 A1 | 5/2010 | Kim et al. |
| 2010/0295600 A1 | 11/2010 | Kim et al. |
| 2011/0050320 A1 | 3/2011 | Gillingham |
| 2011/0156034 A1 | 6/2011 | Cui et al. |
| 2011/0156736 A1 | 6/2011 | Yun et al. |
| 2011/0161753 A1 | 6/2011 | Park et al. |
| 2012/0069685 A1* | 3/2012 | Ide et al. ............... 365/189.05 |

OTHER PUBLICATIONS

Reda et al., "Maximizing the Functional Yield of Wafer-to-Wafer 3-D Integration", IEEE Transactions on Very Large Scale Integration (VLSI) Systems, Sep. 2009, vol. 17, No. 9, p. 1357-p. 1362.

Kang et al., "8Gb 3D DDR3 DRAM Using Through-Silicon-Via Technology", IEEE International Solid-State Circuits Conference, 2009, p. 130-p. 132.

Li et al., "Yield Enhancement for 3D-Stacked Memory by Redundancy Sharing across Dies", ICCAD, 2010, p. 230-p. 234.

Chou et al., "Memory Repair by Die Stacking with Through Silicon Vias", IEEE International Workshop on Memory Technology, Design, and Testing, 2009, p. 53-p. 58.

Chang et al., "A Built-In Redundancy-Analysis Scheme for RAMs with 3D Redundancy", VLSI-DAT, 2011, p. 1-p. 4.

Chou et al., "Yield-Enhancement Techniques for 3D Random Access Memories", VLSI-DAT, 2010, p. 104-p. 107.

Kang et al., "8 Gb 3-D DDR3 DRAM Using Through-Silicon-Via Technology", IEEE Journal of Solid-State Circuits, Jan. 2010, vol. 45, No. 1, p. 111-p. 119.

Chou et al., "Yield Enhancement by Bad-Die Recycling and Stacking With Though-Silicon Vias", IEEE Transactions on Very Large Scale Integration (VLSI) Systems, Aug. 2011, vol. 19, No. 8, p. 1346-p. 1356.

Anigundi et al., "Architecture Design Exploration of Three-Dimensional (3D) Integrated DRAM", 10th Int'l Symposium on Quality Electronic Design, 2009, p. 86-p. 90.

Singh, "Exploiting Rotational Symmetries for Improved Stacked Yields in W2W 3D-SICs", 29th IEEE VLSI Test Symposium, 2011, p. 32-p. 37.

* cited by examiner

|      | CHIP_1 | CHIP_2 | CHIP_3 | CHIP_4 | CHIP_5 | CHIP_6 | CHIP_7 | –   |
|------|--------|--------|--------|--------|--------|--------|--------|-----|
| SC_1 | 111    | 110    | 101    | 010    | 100    | 001    | 011    | 000 |
| ID_1 | <u>111</u> | 110 | 101    | 010    | 100    | 001    | 011    | 000 |
| ID_2 | 011    | <u>111</u> | 110 | 101    | 010    | 100    | 001    | 000 |
| ID_3 | 001    | 011    | <u>111</u> | 110 | 101    | 010    | 100    | 000 |
| ID_4 | 100    | 001    | 011    | <u>111</u> | 110 | 101    | 010    | 000 |
| ID_5 | 010    | 100    | 001    | 011    | <u>111</u> | 110 | 101    | 000 |
| ID_6 | 101    | 010    | 100    | 001    | 011    | <u>111</u> | 110 | 000 |
| ID_7 | 110    | 101    | 010    | 100    | 001    | 011    | <u>111</u> | 000 |

FIG. 6

REPAIRABLE MULTI-LAYER MEMORY CHIP STACK AND METHOD THEREOF

CROSS-REFERENCE TO RELATED APPLICATION

This application claims the priority benefit of Taiwan application serial no. 100147476, filed on Dec. 20, 2011. The entirety of the above-mentioned patent application is hereby incorporated by reference herein and made a part of this specification.

BACKGROUND OF THE DISCLOSURE

1. Field of the Disclosure

The disclosure relates to a chip stack. Particularly, the disclosure relates to a repairable multi-layer memory chip stack.

2. Description of Related Art

A three-dimensional (3D) chip integration technology can be used for reducing the wire length of interconnection to improve system performance. Regarding an electronic device having a regular structure, for example, a memory chip, therefore the memory capacity can be dramatically increased according to an existing chip fabrication process through the 3D chip integration technology without re-planning the lay-out of the chip and fabricating one or more new optical masks to meet the memory requirements for new hardware. In general, the 3D chip integration technology means that semiconductor chips are stacked in a same electric package by using a through-silicon-via (TSV) interconnection process. At least one redundant or spare memory block is generally disposed in internal of the memory chip in order to repair the memory chip.

SUMMARY

The disclosure is directed to a repairable multi-layer memory chip stack, in which a redundant repair unit is used to repair any memory chip in the chip stack.

An embodiment of the disclosure provides a repairable multi-layer memory chip stack. The chip stack includes a plurality of memory chips. The memory chips are coupled to an address bus and a data bus. Each of the memory chips includes a control unit, a decoding unit, a memory array module and a redundant repair unit. The control unit receives an identification (ID) code, and correspondingly generates an activation signal. The decoding unit is coupled to the address bus for receiving a memory address, and correspondingly generates a decoded address. The memory array module is coupled to the decoding unit for receiving the decoded address, and is coupled to the control unit for receiving the activation signal. The memory array module determines whether to allow the data bus to access the data in the memory array module corresponding to the decoded address according to the activation signal. The redundant repair unit is coupled to the decoding unit, where the redundant repair unit includes at least one set of a redundant repair element, and each set of the redundant repair element is composed of a valid field, a chip ID field, a faulty address field and a redundant memory. When the value of the valid field of one of the redundant repair elements in the redundant repair unit is valid (or enabled), the value of the chip ID field of the redundant repair element matches the ID code, and the value of the faulty address field of the redundant repair element matches the decoded address, the redundant memory of the redundant repair element is coupled to the data bus.

An embodiment of the disclosure provides a method for repairing a multi-layer memory chip stack, which includes following steps. A redundant repair unit is configured in a memory chip, where the redundant repair unit includes at least one set of a redundant repair element, and each set of the redundant repair element includes a valid field, a chip ID field, a faulty address field and a redundant memory. A memory address on an address bus is decoded to generate a decoded address and a decoded redundant address. When an ID code is matched, and corresponding memory element of a decoded address is fault free, a data access port of a memory array module of the memory chip is enabled such that a data bus can access the memory array module through the data access port. If the value of the valid field of one of the redundant repair elements in the redundant repair unit is valid, the ID code matches the value of the chip ID field of the redundant repair element, and the memory address matches the value of the faulty address field of the redundant repair element, the redundant memory of the redundant repair element is enabled such that the data bus can access the redundant memory.

An embodiment of the disclosure provides a repairable multi-layer memory chip stack. The repairable multi-layer memory chip stack includes a plurality of memory chips. The memory chips are coupled to an address bus and a data bus, and each of the memory chips includes a control unit, a decoding unit, a memory array, at least one switch control unit, a redundant repair unit, a valid mask unit and a plurality of multiplexers. The control unit receives an ID code to correspondingly generate an activation signal. The decoding unit is coupled to the address bus for receiving a memory address, and generates a decoded address and a decoded redundant address. The memory array is coupled to the decoding unit for receiving the decoded address, wherein bit-lines of the memory array are determined whether to allow the data bus to access data in the bit-lines corresponding the memory address according to the activation signal and the decoded address. The at least one switch control unit determines whether to enable the last bit(s) of the bit-lines according to a test result of the memory array. The redundant repair unit is coupled to the decoding unit, wherein the redundant repair unit comprises at least one set of a redundant repair element, and each set of the redundant repair element comprises a valid field, a chip ID field and a redundant memory. The valid mask unit receives the decoded address, wherein the valid mask unit determines whether to allow the data bus to access the redundant memory according to the activation signal and the decoded address. The plurality of multiplexers receives at least a selection signal from the valid mask unit to determine which bit-lines can be connected to the data bus. Wherein, the redundant memory of one set of redundant repair elements in the redundant repair unit is coupled to the data bus when value of the valid field of the redundant repair element is a valid state, and value of the chip ID field of the redundant repair element matches the ID code.

According to the above descriptions, in the embodiments of the disclosure, since the chip ID field used for storing the ID code or an activation code of a memory chip with a faulty element is added to the redundant repair unit, a cross-layer memory repair mechanism is achieved without using any additional through-silicon-via (TSV), so that the cross-layer repair mechanism can be used to improve the yield of three-dimensional (3D) memory stack without using a complicated decoder circuit and TSV design.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6 is a truth table of activating codes of each stacked layer when seven layers of memory chips of FIG. 4 are stacked.

DETAILED DESCRIPTION OF DISCLOSED EMBODIMENTS

Figure 1A:
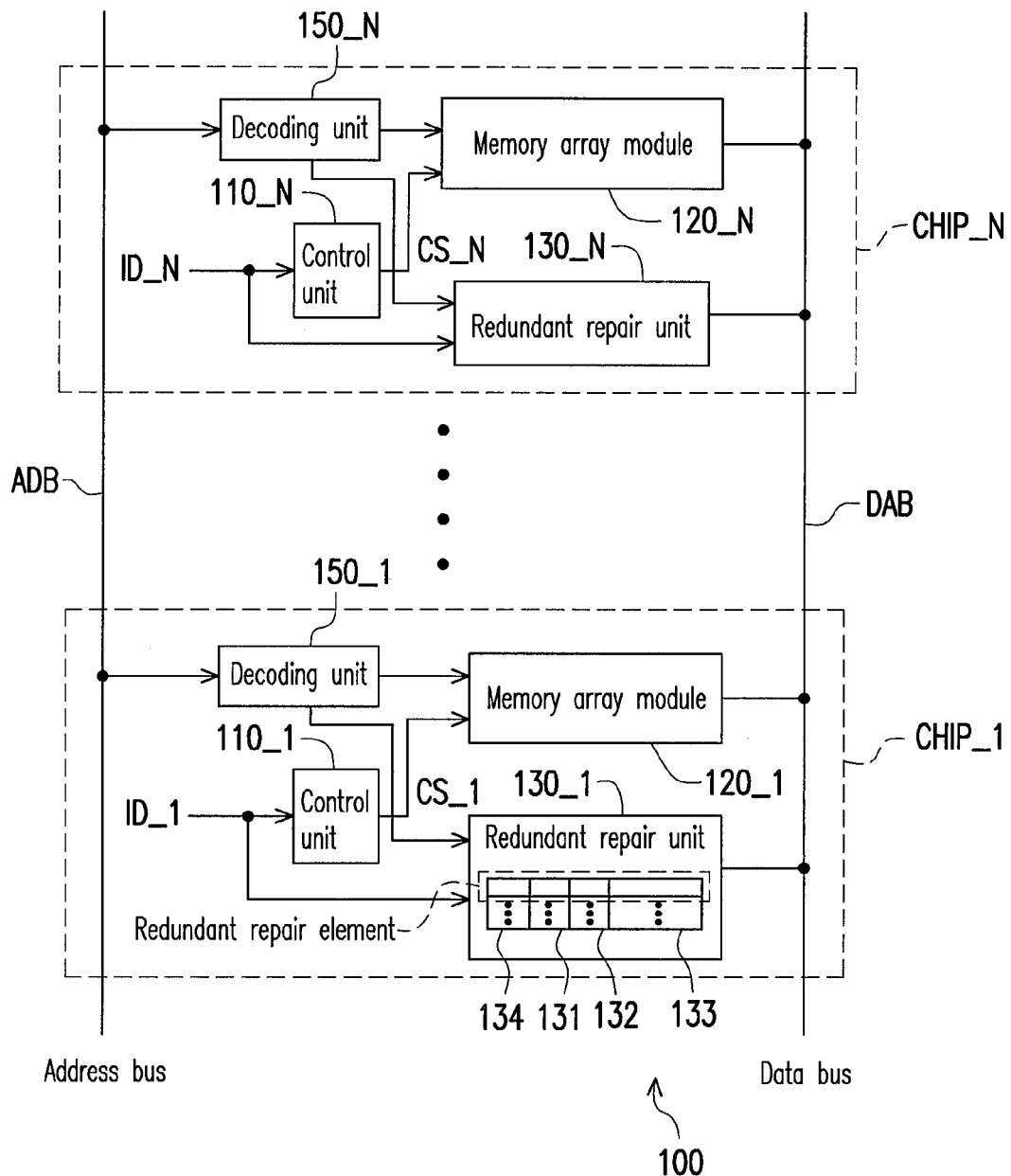
FIG. 1A is a block schematic diagram of a repairable multi-layer memory chip stack according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a block schematic diagram of a repairable multi-layer memory chip stack 100 according to an embodiment of the disclosure. The chip stack 100 includes a plurality of memory chips CHIP_1-CHIP_N. The memory chips CHIP_1-CHIP_N are coupled to an address bus ADB and a data bus DAB. Signals are transmitted between the memory chips CHIP_1-CHIP_N through a through-silicon-via (TSV) connection technique. Each of the memory chips CHIP_1-CHIP_N includes a decoding unit, a control unit, a memory array module and a redundant repair unit. For example, the memory chip CHIP_1 includes a control unit 110_1, a memory array module 120_1, a redundant repair unit 130_1 and a decoding unit 150_1. Compositions of the other memory chips are identical to that of the memory chip CHIP_1. For example, the memory chip CHIP_N includes a control unit 110_N, a memory array module 120_N, a redundant repair unit 130_N and a decoding unit 150_N. For simplicity's sake, other related signal paths of the memory array module 120_1 are not illustrated in FIG. 1A. The chip stack 100 of the present embodiment can achieve a cross-layer memory repair function, for example, the redundant repair unit 130_1 of the memory chip CHIP_1 is used to repair the memory array module 120_N of the memory chip CHIP_N.

In a post fabrication process of the chip stack 100, the memory array module of each of the memory chips CHIP_1-CHIP_N can be tested to find all of the faulty memory elements in the memory array module. The repair steps of the multi-layer memory chip stack 100 are as follows.

The memory chips are first tested and a repair algorithm is used to repair the faulty elements of the memory chips, or the faulty addresses of the memory chips are stored, so that when the memory chips are stacked and performed a final test, the identification (ID) code matched to the chip which contains the faulty element and the value of the faulty address is stored to the redundant repair element that can be used to repair the faulty address.

Before stacking the memory chips, the tested memory chips CHIP_1-CHIP_N are divided into four types:

a. the first type memory chips are those still remaining some redundant repair elements that can be used for repairing other chip layers after the pre-stacking test and repair procedure is complete;

b. the second type memory chips are those neither having faulty memory element nor remaining the redundant repair element that can be used for repairing other chip layers after the pre-stacking test and repair procedure is complete;

c. the third type memory chips are those having a small part of faulty memory element that can be repaired through the redundant repair element on the other chip layers; and d. the fourth type memory chips are those having too many faulty memory elements that cannot be completely repaired by the redundant repair elements of the other chip layers, and such type of the memory chips can not be used for stacking 3D memory.

When memory chips are stacked, only the first type, the second type and the third type of memory chips can be used for stacking 3D memory.

Before the memory chips are stacked, if the chip stack 100 has the third type memory chips, the number of the redundant repair elements required by all of the third type memory chips in the chip stack is first calculated, and in the chip stack 100, at least one first type memory chip is used, and the number of the redundant repair elements that can be used in this (these) memory chip(s) has (have) to be greater than or equal to the total required number of the redundant repair elements of the third type memory chips.

When a faulty memory element of a third type memory chip is detected, the ID code of the third type memory chip and the address of the faulty memory element is stored to an available redundant repair element of a first type memory chip, and such step is repeated until the chip ID codes and the addresses of all of the faulty memory elements are stored to the available redundant repair elements.

Figure 1B:
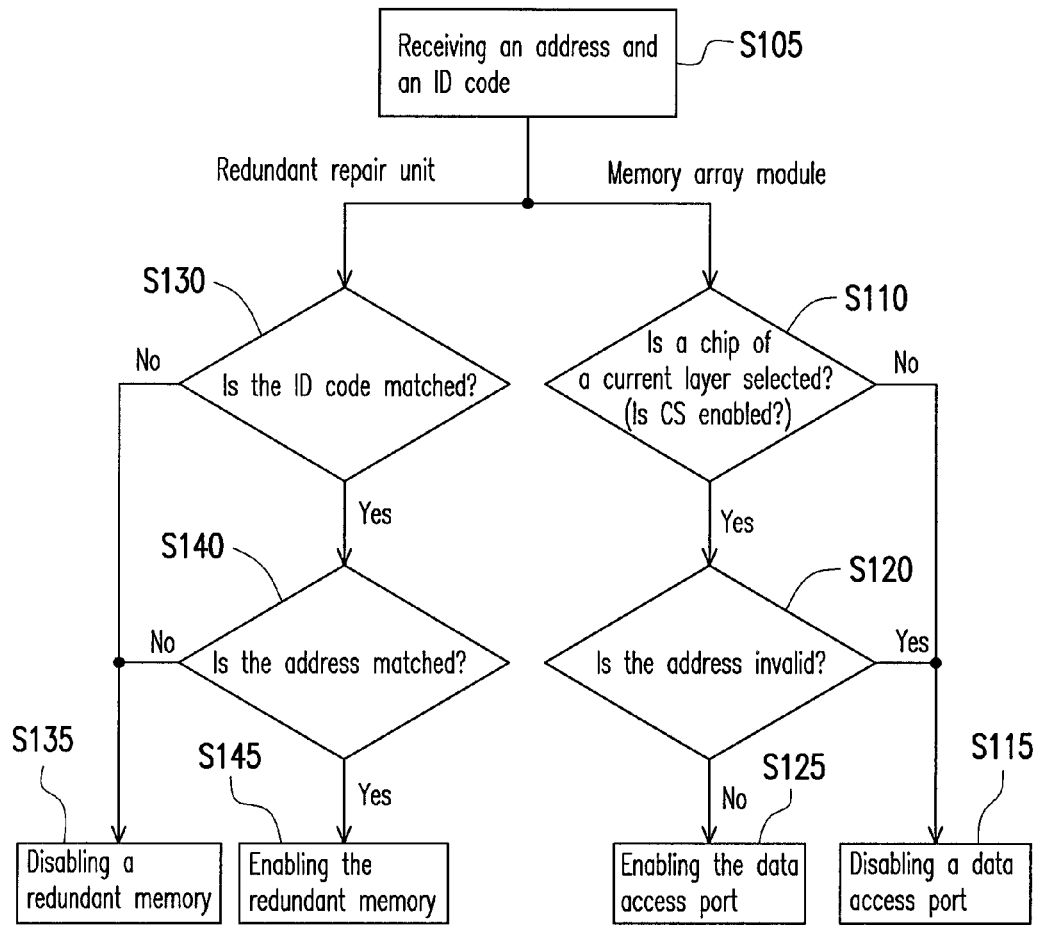
FIG. 1B is a schematic diagram illustrating an operation flow of the multi-layer memory chip stack of FIG. 1A according to an embodiment of the disclosure.

FIG. 1B is a schematic diagram illustrating an operation flow of the multi-layer memory chip stack 100 of FIG. 1A according to an embodiment of the disclosure. Referring to FIG. 1A and FIG. 1B, the memory chips CHIP_1-CHIP_N respectively receive a memory address and an ID code (step S105). The decoding unit 150_1 is coupled to the address bus ADB for receiving the memory address. The decoding unit 150_1 decodes the memory address on the address bus ADB to generate a decoded address to the memory array module 120_1, and/or generate a decoded redundant address to the redundant repair unit 130_1. The decoded address includes a decoded row address and a decoded column address, and the decoded redundant address includes a decoded redundant row address and a decoded redundant column address. In some embodiments, the decoding units 150_1 can share a same pre-decoder unit to decode the memory address on the address bus ADB, and a decoding result output by the pre-decoder unit is taken as the decoded address and the decoded redundant address. In some other embodiments, the decoding units 150_1 use different pre-decoder units to decode the memory address on the address bus ADB, so as to respectively generate the decoded address and the decoded redundant address. In some other embodiments, the decoding unit 150 has no pre-decoder, and it directly decodes the memory address on the address bus ADB into the decoded address or the decoded redundant address.

The memory array module 120_1 and the decoding unit 150_1 can also be implemented by other well-known techniques of the memory technique domain. Regardless of the implementations of the memory array module 120_1 and the decoding unit 150_1, and regardless whether the memory type is volatile memory or non-volatile memory, they can all be applied in the present embodiment.

The control unit 110_1 receives an ID code ID_1 and correspondingly generates an activation signal CS_1 (step S105). If the ID code ID_1 is matched, the activation signal CS_1 is enabled. The memory array module 120_1 is coupled to the control unit 110_1 to receive the activation signal CS_1. The memory array module 120_1 determines whether to allow the data bus DAB to access the data in the memory array module 120_1 corresponding to the memory address (step S110) according to the value of the valid mask. If the activation signal CS_1 is disabled, the data access port of the memory array module 120_1 is disabled (step S115). When the memory chip CHIP_1 is selected (i.e. the activation signal CS_1 is enabled), a memory controller can send a memory address to the memory array module 120_1 through the address bus ADB and the decoding unit 150_1. The memory array module 120_1 checks whether the corresponding memory element of the memory address on the address bus ADB is faulty or not (step S120), for example, checks whether the value of the valid mask of a decoded address of the memory array module 120_1 is enabled (or valid). If the corresponding memory elements of the current decoded address is faulty, i.e. the value of the valid mask of the current decoded address is invalid (or disabled), the data access port of the memory array module 120_1 is disabled (step S115). If the corresponding memory element of the current decoded address is not faulty, the data access port of the memory array module 120_1 is enabled (step S125). Then, the data bus DAB can access the data of the current decoded address of the memory array module 120_1 through the data access port.

The redundant repair unit 130_1 is coupled to the decoding unit 150_1 and the data bus DAB. The redundant repair unit 130_1 includes at least one set of a redundant repair element. The redundant repair unit 130_N is coupled to the decoding unit 150_N and the data bus DAB, and the redundant repair unit 130_N also includes at least one set of a redundant repair element. The redundant repair element can be a redundant row repair element or a redundant column repair element according to the repair circuitry of the redundant repair element. For example, in the redundant repair unit 130_1 of FIG. 1A, each set of the redundant repair element includes a chip ID field 131, a faulty address field 132, a redundant memory 133 and a valid field 134. When the value of the valid field 134 of one set of the redundant repair elements in the redundant repair unit 130_1 is valid, the value of the chip ID field 131 of the redundant repair element matches the ID code ID_1, and the value of the faulty address field 132 of the redundant repair element matches the decoded address of the decoding unit 150_1, the redundant memory 133 of the redundant repair element in the redundant repair unit 130_1 is coupled to the data bus DAB. The value of the faulty address field 132 can be a row address or a column address according to the circuitry type of the redundant repair unit 130_1. Similarly, the redundant memory 133 can be a redundant row memory or a redundant column memory according to the circuitry type of the redundant repair unit 130_1, and the redundant row memory or the redundant column memory is not limited to repair one row or one column in the memory array, but can repair a plurality of rows or columns of blocks in the memory array.

In the post fabrication process of the chip stack 100, the memory array module of each of the memory chips CHIP_1-CHIP_N can be tested to find the faulty memory elements in the memory array module. For example, in the memory array module 120_1 of the memory chip CHIP_1, the memory element corresponding to an address X is faulty, and in the post fabrication process of the chip stack 100, a decoded redundant address dec_redundant_X generated by the decoding unit according to the address X can be stored to the faulty address field 132 of one of the redundant repair elements in the redundant repair unit 130_1 of the memory chip CHIP_1, and the ID code ID_1 of the memory chip CHIP_1 (or other ID information corresponding to the memory chip CHIP_1) can be stored to the chip ID field 131 of the redundant repair element.

When the memory element corresponding to the address X in the memory array module 120_1 of the memory chip CHIP_1 is accessed, the memory chip CHIP_1 receives the ID code of the memory chip CHIP_1 and the memory address X (the step S105). Then, in the step S130, the redundant repair unit 130_1 checks whether the values of the chip ID fields 131 of all of the redundant repair elements match the ID code received in the step S105. If the value of the chip ID field 131 of a redundant repair element in the redundant repair unit 130_1 is not matched to the ID code, the redundant memory 133 in the redundant repair element corresponding to the value of the chip ID field 131 is disabled (step S135). In step S140, the redundant repair unit 130_1 checks whether the value of the faulty address field 132 of the redundant repair element matches the decoded redundant address received in the step S105 if the value of the chip ID field of a redundant repair element is matched to the ID code received in the step S105. If the value of the faulty address field 132 of the redundant repair element does not match, then the redundant memory 133 in the redundant repair element corresponding to the faulty address field 132 is disabled (step S135). If the value of the chip ID field of the redundant repair element matches the ID code received in the step S105, and the address value of the corresponding faulty address field 132 matches the decoded redundant address received in the step S105, the redundant memory 133 in the corresponding redundant repair element is enabled (step S145). Thus, the redundant memory 133 in the corresponding redundant repair element of the redundant repair unit 130_1 can be used to replace the faulty memory element corresponding to the address X in the memory array module 120_1. Therefore, the redundant repair unit 130_1 can be used to repair the memory array module 120_1 of the memory chip CHIP_1. Each memory address can only correspond to a memory element of the memory array module or one set of the redundant repair element in one of the memory chips of the memory chip stack.

For another example, it is assumed that the memory element corresponding to an address Y in the memory array module 120_N of the memory chip CHIP_N is a faulty memory element, in the post fabrication process of the chip stack 100, a decoded redundant address dec_redundant_Y generated by the decoding unit according to the address Y can be stored to the faulty address field 132 of one of the redundant repair elements in the redundant repair unit 130_1 of the memory chip CHIP_1, and the ID code ID_N of the memory chip CHIP_N (or other ID information corresponding to the memory chip CHIP_N) can be stored to the chip ID field 131 of the corresponding redundant repair element in the redundant repair unit 130_1 of the memory chip CHIP_1. When the memory element corresponding to the address Y in the memory array module 120_N of the memory chip CHIP_N is accessed, since the values of the chip ID field 131 and the faulty address field 132 respectively match to the ID code and the decoded redundant address that the redundant repair unit 130_1 receives, the redundant memory 133 of the corresponding redundant memory element in the redundant repair unit 130_1 of the memory chip CHIP_1 can be used to replace the faulty memory element corresponding to the address Y in the memory array module 120_N of the memory chip CHIP_N. Therefore, the redundant repair unit 130_1 can be used for repairing the memory array module 120_N of the other memory chip CHIP_N with a cross-layer scheme. Based on the cross-layer repair technique disclosed by the present embodiment, the yield of the 3D memory chip stack is improved without adding a complicated decoder circuit and a lot of extra TSVs.

The ID codes ID_1-ID_N respectively received by the memory chips CHIP_1-CHIP_N can be a same ID code transmitted from a chip selection bus, or can be distinct ID codes generated by an ID code generator. Namely, the ID codes ID_1-ID_N can be same codes or distinct codes. If the ID codes ID_1-ID_N are the same code, all activation codes built in the control units of CHIP_1-CHIP-N are different to each other. If the ID codes ID_1-ID_N are distinct from each other, all activation codes built in the control units of CHIP_1-CHIP-N are the same code. Implementations of the same/distinct ID codes are described in detail later. Therefore, if a faulty element of the memory chip CHIP_N is repaired by a redundant repair element of the memory chip CHIP_1, the value of ID code ID_1 of the memory chip CHIP_1 is stored to the chip ID field 131 of the redundant repair element in the redundant repair unit 130_1 of the memory chip CHIP_1 while the corresponding ID code ID_N activates the memory chip CHIP_N.

Figure 2:
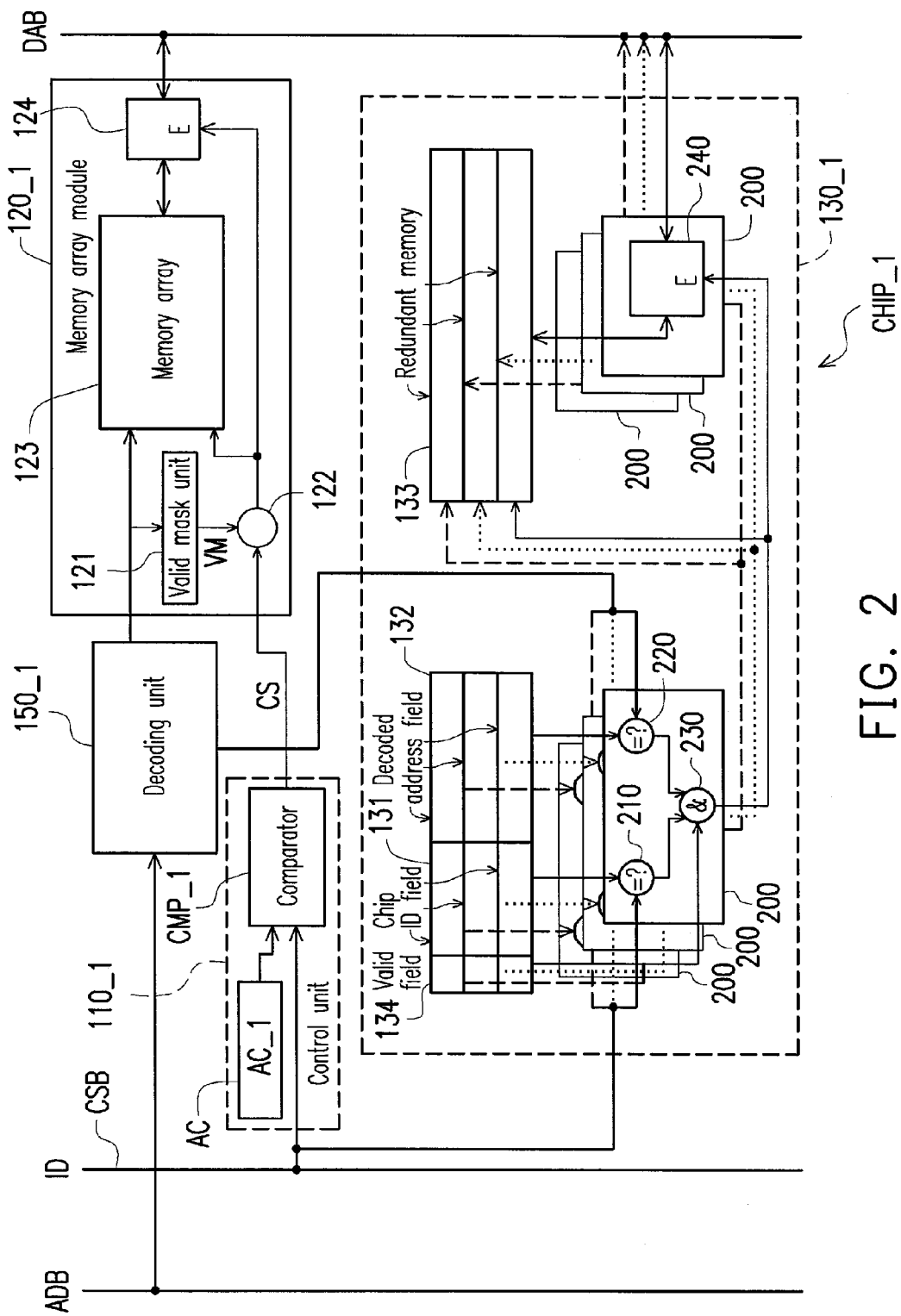
FIG. 2 is a block schematic diagram of a memory chip CHIP_1 of FIG. 1A according to an embodiment of the disclosure.

FIG. 2 is a block schematic diagram of the memory chip of FIG. 1A repairing row memory according to an embodiment of the disclosure. In the present embodiment, an application of the "same ID code" is described. Descriptions of the other memory chips (for example, the memory chip CHIP_N) in the chip stack 100 can refer to the related descriptions of the memory chip CHIP_1. In the present embodiment, the control units (for example, the control unit 110_1) of the memory chips CHIP_1-CHIP_N are all coupled to the chip selection bus CSB for receiving a same ID code ID. A set of activation codes AC which different to each other are respectively built in the control units of the memory chips CHIP_1-CHIP_N, for example, the activation code AC built in the control unit 110_1 of the memory chip CHIP_1 is AC_1, and the activation code AC built in the control unit 110_N of the memory chip CHIP_N is AC_N.

The activation code AC of each chip layer in FIG. 2 can be built in the circuit during fabrication, or a fuse circuit can be programmed to generate the activation code AC. For example, the fuse circuits on different memory chips are programmed before or during the chip stacking process to generate different activation codes. Alternatively, an activation code generator (for example, an adder) is used to generate the different and fixed activation code. Regardless of the pre-defined activation codes or the activation codes generated by the activation code generators, in a same memory chip stack, each memory chip owns a different (unique) activation code.

The memory controller can simultaneously output the ID code ID to the control units 110_1-110_N of all of the memory chips CHIP_1-CHIP_N through the chip selection bus CSB, so as to selectively activate one of the memory chips CHIP_1-CHIP_N. Comparators are built in the control units 110_1-110_N respectively, for example, a comparator CMP_1 is built in the control unit 110_1. The comparator CMP_1 compares whether the ID code ID of the chip selection bus CSB matches to the activation code AC_1 built in the control unit 110_1 or not.

When the ID code ID of the chip selection bus CSB matches the activation code AC_i built in the control unit 110_i of the $i^{th}$ memory chip CHIP_i in the memory chips CHIP_1-CHIP_N, the control unit 110_i of the $i^{th}$ memory chip CHIP_i activates the memory array module of the $i^{th}$ memory chip CHIP_i. For example, when the comparator CMP_1 detects that the ID code ID of the chip selection bus CSB matches the activation code AC_1 built in the control unit 110_1 of the memory chip CHIP_1 and the output signal of a valid mask unit 121 is true (which represents that the memory element corresponding to the memory address is valid), the control unit 110_1 of the memory chip CHIP_1 outputs the activation signal CS to activate the memory array module 120_1 of the memory chip CHIP_1.

Referring to FIG. 2, in the present embodiment, the memory array module 120_1 includes a memory array 123, a valid mask unit 121, a logic circuit 122 and a switch circuit 124. The decoding unit 150_1 decodes the memory address on the address bus ADB and outputs a corresponding decoded address to the memory array 123 and the valid mask unit 121, and generates a corresponding decoded redundant row address to the redundant repair unit 130_1. The valid mask unit 121 is coupled to the decoding unit 150_1 for receiving the decoded address to correspondingly generate a valid mask signal VM. The valid mask unit 121 is a programmable logic device (for example, a fuse), which can store the valid state of each row of the memory array during the memory chip test procedure. The logic circuit 122 receives the activation signal CS and the valid mask signal VM of the valid mask unit 121, and outputs a signal to the memory array 123 and the switch circuit 124. When the memory element corresponding to the memory address is faulty, the valid mask signal VM is set to disable state to turn off the memory array 123 and the switch circuit 124. Otherwise, the valid mask signal VM is set to enable state. The activation signal CS of the control unit 110_1 and the valid mask signal VM of the valid mask unit 121 determine whether to enable or disable the memory array 123. The switch circuit 124 which is coupled between the memory array 123 and the data bus DAB is controlled by the output signal of the logic circuit 122. The switch circuit 124 is a switch circuit and can be implemented by using a transmission gate or a tri-state buffer, etc. When the activation signal CS and the valid mask signal VM of the valid mask unit 121 are all enabled, the switch circuit 124 is enabled to allow the data bus DAB access the memory array 123. Otherwise, the switch circuit 124 is disabled, and the data bus DAB cannot access the memory array 123.

In the present embodiment, the redundant repair unit 130_1 further include a plurality of redundant control units 200. The redundant control unit 200 receives the values of the valid field 134, the chip ID field 131 and the faulty address field 132 of the corresponding redundant repair element, and determines whether or not to couple the redundant memory 133 of the corresponding repair element to the data bus DAB according to these values. Each of the redundant control units 200 includes a first comparator 210, a second comparator 220, an AND gate 230 and a switch circuit 240. A first input of the first comparator 210 receives the ID code ID of the chip selection bus CSB. A second input of the first comparator 210 is coupled to the corresponding chip ID field 131. When the ID code ID of the chip selection bus CSB matches the value of the chip ID field 131, the logic value output by the first comparator 210 is true. Otherwise, the logic value is false.

A first input of the second comparator 220 receives the decoded redundant row address output by the decoding unit 150_1. A second input of the second comparator 220 is coupled to the corresponding faulty address field 132. When the decoded redundant row address of the decoding unit 150_1 matches the value of the faulty address field 131, a logic value output by the second comparator 220 is true. Otherwise, the logic value is false.

A first input of the AND gate 230 is coupled to the output of the first comparator 210, a second input of the AND gate 230 is coupled to the output of the second comparator 220, and a third input of the AND gate 230 is coupled to the corresponding valid field 134. Therefore, if the value of the valid field 134 is true, the values of the chip ID field 131 and the faulty address field 132 corresponding to the valid field 134 are valid. Otherwise, the values of the chip ID field 131 and the faulty address field 132 corresponding to the valid field 134 are invalid.

The output of the AND gate 230 is coupled to the redundant row memory 133 in the corresponding redundant repair element and the control signal of the switch circuit 240. A first port and a second port of the switch circuit 240 are respectively coupled to the redundant row memory 133 in the corresponding redundant repair element and the data bus DAB. Only when the value of the valid field 134 is true, the AND gate 230 can control the switch circuit 240 according to the outputs of the comparators 210 and 220. The AND gate 230 determines whether or not to enable the redundant row memory 133 in the corresponding redundant repair element to be accessible, and to enable the switch circuit 240 to allow the data bus DAB to couple to the redundant row memory 133 in the corresponding redundant repair element. The redundant row memory 133 can be implemented as a single repair row or a group of multiple repair rows according to design requirements.

For example, the memory element with a row address X in the memory array 123 is a faulty element, then a decoded redundant address dec_redundant_X generated by the decoding unit according to the row address X can be stored to the faulty address field 132 of one of the redundant repair elements in the redundant repair unit 130_1, and the activation code AC_1 of the memory chip CHIP_1 can be stored to the chip ID field 131 of the redundant repair element in the redundant repair unit 130_1. Now, the value of the valid field 134 of the redundant repair element is set to "true". When the memory controller is about to access the memory element corresponding to the address X in the memory array 123 of the memory chip CHIP_1, the memory controller outputs the ID code ID with the value of AC_1 to the memory chips CHIP_1-CHIP_N through the chip selection bus CSB. Since the ID code ID of the chip selection bus CSB matches the value of the chip ID field 131 (i.e. the activation code AC_1), the logic value output by the first comparator 210 is true. On the other hand, since the decoded redundant row address (i.e. an address dec_redundant_X) output by the decoding unit 150_1 matches the value of the faulty address field 132, the logic value output by the second comparator 220 is true. When the outputs of the comparators 210 and 220 are all true, and the value of the valid field 134 is true, the AND gate 230 enables the redundant row memory 133 in the corresponding redundant repair element and the corresponding switch circuit 240 to allow the data bus DAB couple to the redundant row memory 133 in the corresponding redundant repair element. Now, the redundant row memory 133 in the corresponding redundant repair element of the redundant repair unit 130_1 can be used to replace the faulty memory element corresponding to the row address X in the memory array 123. Therefore, the memory array 123 of the corresponding memory chip CHIP_1 can be repaired by the redundant repair unit 130_1.

For another example, referring to FIG. 1A and FIG. 2, it is assumed that the memory element corresponding to an address Y in the memory array of the memory chip CHIP_N is the faulty memory element, a decoded redundant row address dec_redundant_Y generated by the decoding unit according to the address Y can be stored to the faulty address field 132 of one set of the redundant repair element in the redundant repair unit 130_1 of the memory chip CHIP_1, and the activation code AC_N of the memory chip CHIP_N can be stored to the chip ID field 131 of the redundant repair element in the redundant repair unit 130_1 of the memory chip CHIP_1. Now, the value of the valid field 134 of the redundant repair element is set to "true". When the memory controller is about to access the memory element corresponding to the address Y in the memory array of the memory chip CHIP_N, the memory controller outputs the ID code ID with the value of AC_N to the memory chips CHIP_1-CHIP_N through the chip selection bus CSB. Since the ID code ID of the chip selection bus CSB matches the value of the chip ID field 131 (i.e. the activation code AC_N), the logic value output by the first comparator 210 is true. On the other hand, since the decoded redundant row address (with the value of dec_redundant_Y) output by the decoding unit 150_1 matches the value of the faulty address field 132 (i.e. the address dec_redundant_Y), the logic value output by the second comparator 220 is true. In case that the outputs of the comparators 210 and 220 are all true, and the value of the valid field 134 is true, the AND gate 230 enables the redundant row memory 133 in the corresponding redundant repair element, and the corresponding switch circuit 240 to allow the data bus DAB couple to the redundant row memory 133 in the corresponding redundant repair element. Now, the redundant row memory 133 in the corresponding redundant repair element of the redundant repair unit 130_1 of the memory chip CHIP_1 can be used to replace the faulty memory element corresponding to the address Y in the memory array of the memory chip CHIP_N. Therefore, the redundant repair unit 130_1 of the memory chip CHIP_1 can be used for repairing the memory array of the other memory chip CHIP_N with a cross-layer repair scheme.

Figure 3:
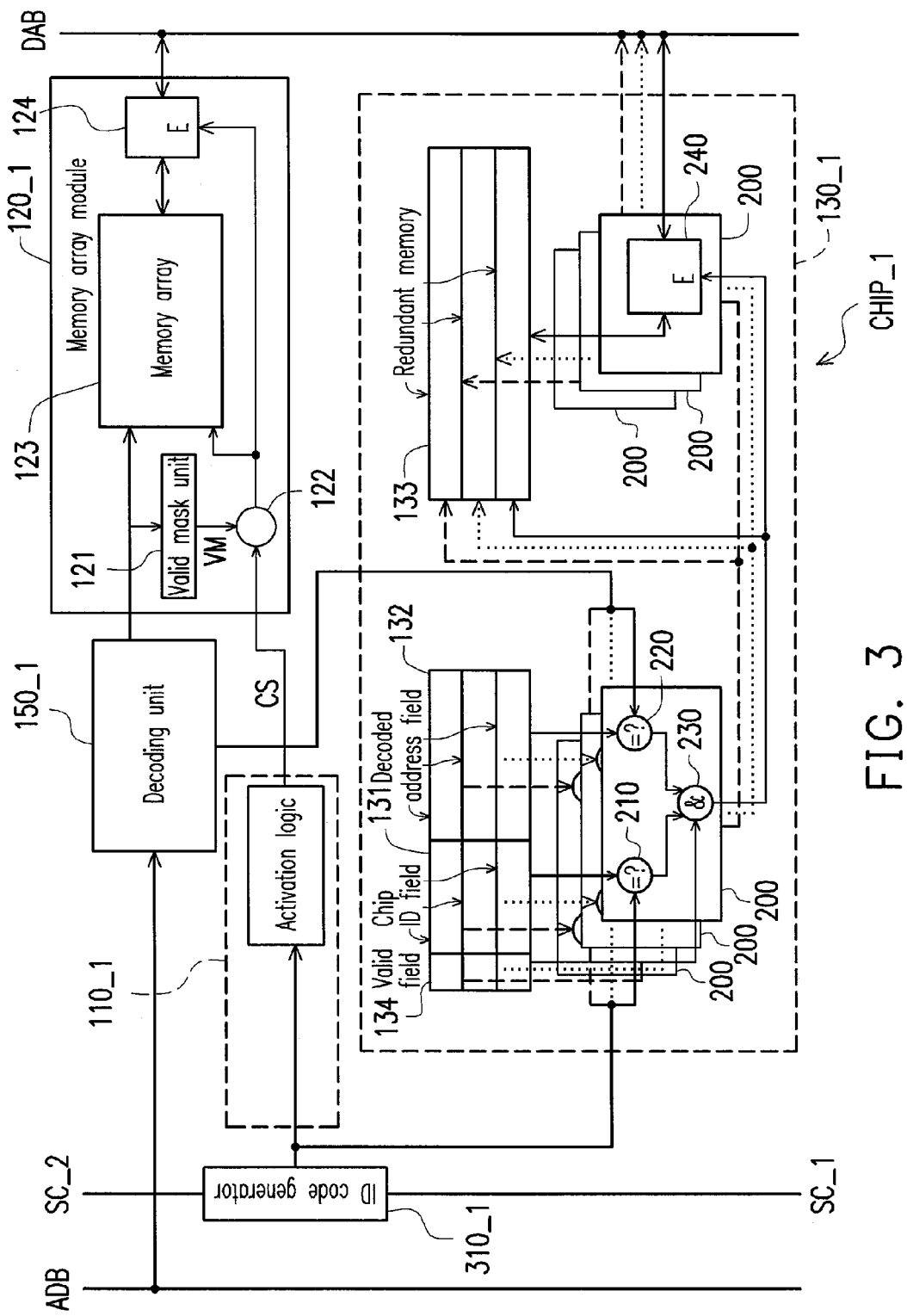
FIG. 3 is a block schematic diagram of the memory chip CHIP_1 of FIG. 1A according to another embodiment of the disclosure.

The disclosure is not limited to the embodiment of FIG. 2. For example, FIG. 3 is a block schematic diagram of the memory chip of FIG. 1A repairing row memory according to another embodiment of the disclosure. In the present embodiment, an application of "the distinct ID code" is described. Descriptions of the other memory chips (for example, the memory chip CHIP_N) in the chip stack 100 can refer to the related descriptions of the memory chip CHIP_1. The embodiment of FIG. 3 can refer to related descriptions of FIG. 1A, FIG. 1B and FIG. 2. Different to the embodiment of FIG. 2, in the embodiment of FIG. 3, the control unit 110_1 is coupled to an ID code generator 310_1 without coupling to the chip selection bus CSB. The ID code generator 310_1 can generate a cyclic code to serve as the ID code ID_1 in accordance with a seed ID code SC_1. In the present embodiment, the memory controller can output the "seed ID code" SC_1 to the ID code generator 310_1 to activate or deactivate the memory chip CHIP_1. Implementations of the ID code generator 310_1 and the control unit 110_1 are described in detail below.

Figure 4:
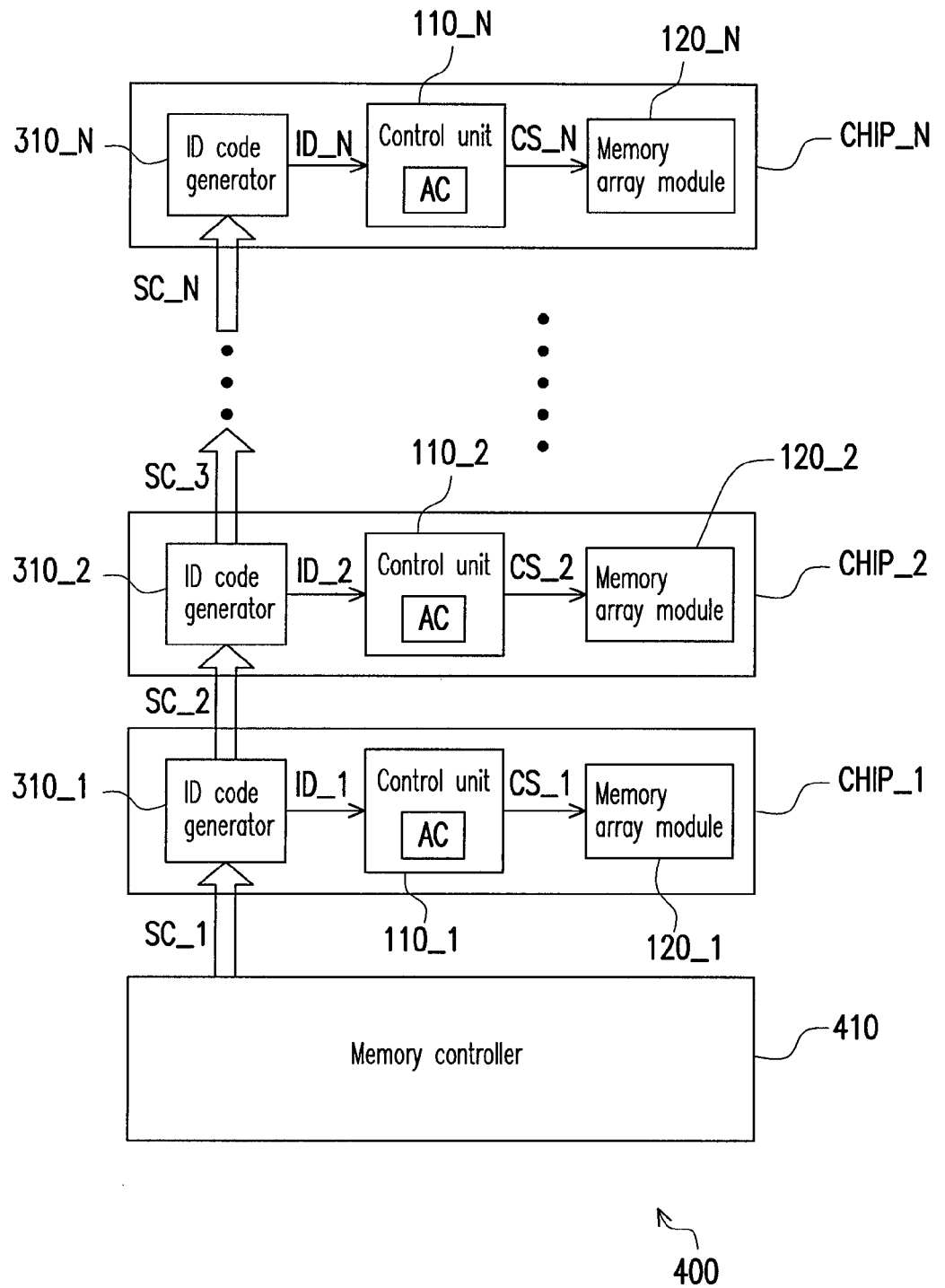
FIG. 4 is a block schematic diagram of a repairable multi-layer memory chip stack according to another embodiment of the disclosure.

FIG. 4 is a block schematic diagram of a repairable multi-layer memory chip stack 400 according to another embodiment of the disclosure. The embodiment of FIG. 4 can refer to related descriptions of FIG. 1A and FIG. 3. For example, although the redundant repair units are not illustrated in FIG. 4, those skilled in the art should understand that each of the memory chips CHIP_1-CHIP_N of the embodiment of FIG. 4 includes a redundant repair unit, and implementation details of the redundant repair units can refer to related descriptions of the redundant repair unit of FIG. 1A. The chip stack 400 includes a memory controller 410 and N memory chips (for example, a first memory chip CHIP_1, a second memory chip CHIP_2 and an $n^{th}$ memory chip CHIP_N). These memory chips can be electrically connected to each other through TSVs and microbumps.

Under control of chip selection signals CS_1-CS_N, it is determined whether or not to activate the memory array modules of the memory chips CHIP_1-CHIP_N. For example, the chip selection signal CS_1 can determine whether or not to activate the memory array module 120_1 of the first memory chip CHIP_1, and the chip selection signal CSN can determine whether or not to activate the memory array module 120_N of the $N^{th}$ memory chip CHIP_N.

Compared to the chip stack 100 of FIG. 1A, the multi-layer memory chip stack 400 of FIG. 4 further includes N ID code generators (for example, a first ID code generator 310_1, a second ID code generator 310_2 and an $N^{th}$ ID code generator 310_N), and N control units (for example, a first control unit 110_1, etc.). An $i^{th}$ ID code generator 310_i is disposed in an $i^{th}$ memory chip CHIP_i of the memory chips CHIP_1-CHIP_N, where i is an integer between 1 and N. For example, the first ID code generator 310_1 is disposed in the first memory chip CHIP_1, the second ID code generator 310_2 is disposed in the second memory chip CHIP_2, and the $N^{th}$ ID code generator 310_N is disposed in the $N^{th}$ memory chip CHIP_N. Implementations of the first memory chip CHIP_1 and the second memory chip CHIP_2 are described below, and the other memory chips (for example, the $N^{th}$ memory chip CHIP_N) can be deduced by analogy.

The first ID code generator 310_1 in the ID code generators 310_1-310_N receives a first seed code SC_1, and generates a first ID code ID_1 and a second seed code SC_2 according to the first seed code SC_1. The $i^{th}$ ID code generator 310_i is electrically connected to an (i−1)th_ID code generator 310_(i−1) for receiving an $i^{th}$ seed code SC_i, and generates an $i^{th}$ ID code ID_i and an $(i+1)^{th}$ seed code SC_(i+1) according to the $i^{th}$ seed code SC_i, where the first ID code ID_1 to the $N^{th}$ ID code ID_N are different to each other. For example, the second ID code generator 310_2 is electrically connected to the first ID code generator 310_1 for receiving the second seed code SC_2, and correspondingly generates the second ID code ID_2 and the third seed code SC_3 according to the second seed code SC_2. The memory controller 410 is electrically connected to the first ID code generator 310_1 for supplying the first seed code SC_1. The first ID code generator 310_1 correspondingly generates the first ID code ID_1 and the second seed code SC_2 according to the first seed code SC_1.

A control unit 110_i of the $i^{th}$ memory chip CHIP_i in the memory chips CHIP_1-CHIP_N is coupled to the $i^{th}$ ID generator 310_i for receiving the $i^{th}$ ID code ID_i to serve as the ID code ID. The internal activation logics of the control units 110_1-110_N are respectively inbuilt with the same activation code AC. The control unit can be implemented by any means, for example, a logic circuit such as a decoder or a comparator, etc., so as to decode and compare the received $i^{th}$ ID code ID_i with the internal activation code AC. After the chip stacking is completed, the activation codes AC built in the control units 110_1-110_N are the same and invariable, and the ID codes ID_1-ID_N are variable. When the $i^{th}$ ID code ID_i received by the control unit 110_i of the $i^{th}$ memory chip CHIP_i in the memory chips CHIP_1-CHIP_N matches the activation code AC, the control unit 110_i of the $i^{th}$ memory chip CHIP_i activates the memory array module of the $i^{th}$ memory chip CHIP_i.

For example, the control unit 110_1 of the first memory chip CHIP_1 is electrically connected to the first ID code generator 310_1 for receiving the first ID code ID_1. When the first ID code ID_1 received by the control unit 110_1 matches the activation code AC built in the control unit 110_1, the control unit 110_1 outputs the chip selection signal CS_1 to activate the memory array module 120_1 of the first memory chip CHIP_1. The other memory chips CHIP_2-CHIP_N can refer to the related descriptions of the memory chip CHIP_1. The second ID code generator 310_2 is electrically connected to the first ID code generator 310_1 for receiving the second seed code SC_2, and correspondingly generates the second ID code ID_2 according to the second seed code SC_2, where the first ID code ID_1 and the second ID code ID_2 are different. Moreover, the second ID code generator 310_2 correspondingly generates the third seed code SC_3 to an ID code generator of a next chip according to the second seed code SC_2. Implementation of the control unit 110_2 of the second memory chip CHIP_2 is the same to that of the control unit 110_1 of the first memory chip CHIP_1. Deduced by analogy, the $N^{th}$ ID code generator 310_N receives an $N^{th}$ seed code SC_N provided by the ID code generator of a previous chip, and correspondingly generates an $N^{th}$ ID code ID_N to the control unit 110_N of the $N^{th}$ memory chip CHIP_N according to the $N^{th}$ seed code SC_N, where the $N^{th}$ ID code ID_N is different to the first ID code ID_1 and the second ID code ID_2.

In the present embodiment, the ID code generators 310_1-310_N are only required to generate different ID codes after stacking, and implementations of the ID code generators 310_1-310_N are not limited. For example, the ID code generators 310_1-310_N can be cyclic code generators or combinational logic circuits. In some embodiments that the circuit designs and layout structures of the memory chips CHIP_1-CHIP_N have to be identical, a combinational logic circuit of linear feedback shift registers (LFSR) can be used to implement the ID code generators 310_1-310_N. Implementations of the ID code generators 310_1-310_N and the control units 110_1-110_N are described in detail below.

The ID code generators 310_1-310_N of the 3D stack semiconductor chips of the present embodiment apply an operation principle of the cyclic code generators, and state variations of the cyclic code generators in time are converted into a logic sequence in space implemented by the combinational logic circuit. One of the ID code generators 310_1-

310_N with the same structure is implemented on each of the stacked semiconductor chips CHIP_1-CHIP_N. As shown in FIG. 4, when the memory chips CHIP_1-CHIP_N are stacked, the ID code generators of the memory chips are connected in series according to a chip stacking sequence. The stacked semiconductor chip CHIP_1 closest to the memory controller 410 receives the first seed code SC_1 sent by the memory controller 410. The ID code generator of the memory chip of each layer generates a new ID code according to the ID code generated by the memory chip of a previous layer, and transmits the new ID code to the memory chip of a next layer. Therefore, the ID code of the memory chip of each layer can be changed according to the first seed code SC_1, and all of the layers receive distinct ID codes, so that it is called "the distinct ID code".

Figure 5:
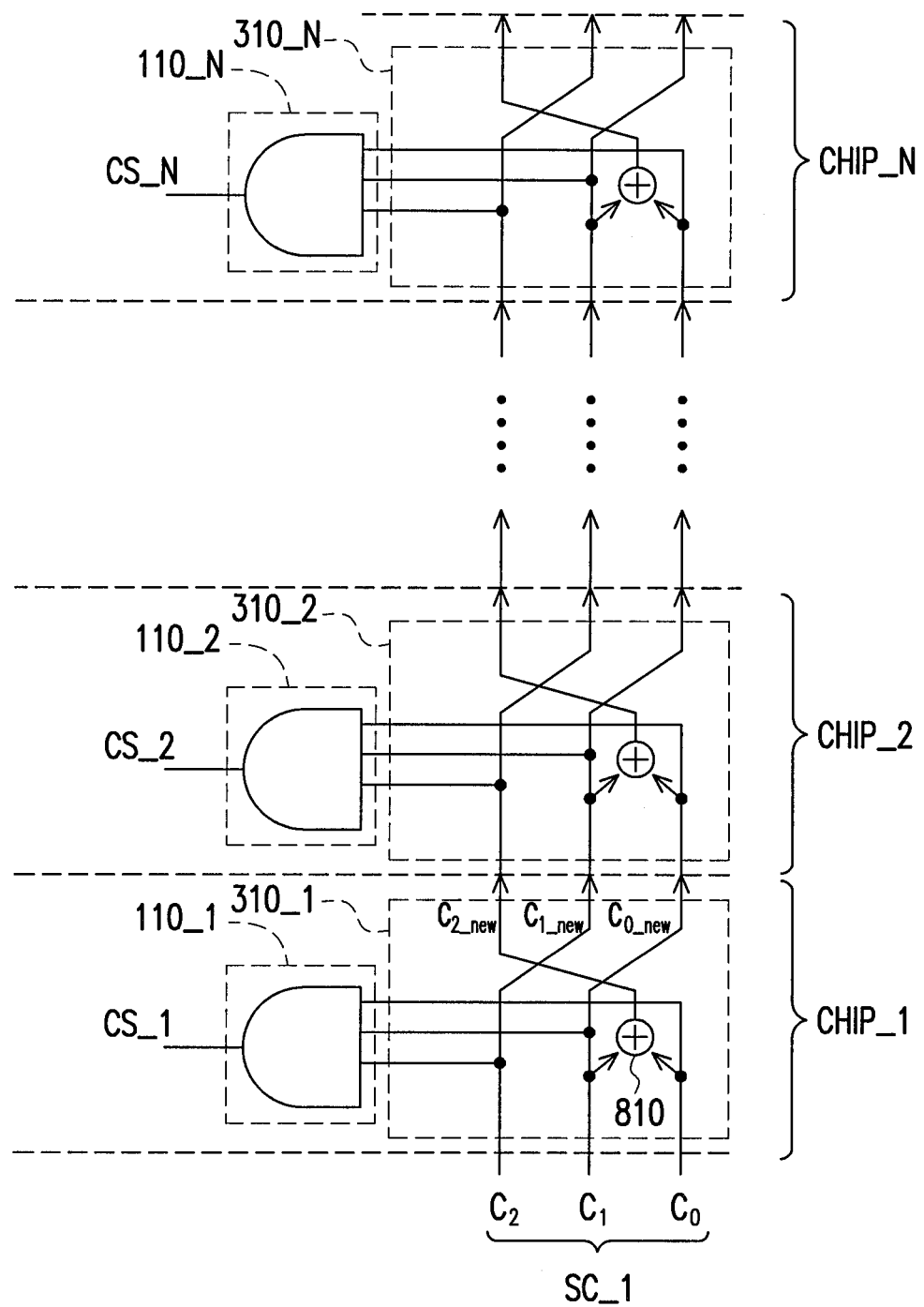
FIG. 5 is a circuit schematic diagram of ID code generators and control units of FIG. 4 according to an embodiment of the disclosure.

FIG. 5 is a circuit schematic diagram of the ID code generators 310_1-310_N and the control units 110_1-110-N of FIG. 4 according to an embodiment of the disclosure. In the present embodiment, the ID code generators 310_1-310_N are implemented with reference of the combinational logic circuit of LFSR of $1+x^2+x^3$. Taking the ID code generator 310_1 of FIG. 5 and FIG. 4 as an example, the first seed code SC_1 includes bits of $C_2$, $C_1$ and $C_0$, and the second seed code SC_2 includes bits of $C_{2\_new}$, $C_{1\_new}$ and $C_{0\_new}$. The bits $C_2$ and $C_1$ are respectively shifted to the bits $C_{1\_new}$ and $C_{0\_new}$ through a winding method, which is a so-called winding displacement. Input terminals of an exclusive gate 810 of the ID code generator 310_1 receive the bits $C_1$ and $C_0$ to generate an output signal to the bit $C_{2\_new}$. Implementations of the other ID code generators (for example, the ID code generators 310_2 and 310_N) are the same to that of the ID code generator 310_1. The control units 110_1-110_N are respectively implemented by an AND gate having three input terminals. As shown in FIG. 5, only when the three inputs are all logic 1, an output of the AND gate is 1. Therefore, the control units 110_1-110_N are respectively inbuilt with the same activation code AC, i.e. "111". Certainly, according to the instruction of the present embodiment, those skilled in the art can also define the activation code AC to other values. In the present embodiment, for example, if the second memory chip CHIP_2 is to be activated, the memory controller 410 outputs "110" to the first ID code generator 310_1 to serve as the first seed code SC_1. If the first memory chip CHIP_1 is to be activated, the memory controller 410 outputs "111" to the first ID code generator 310_1 to serve as the first seed code SC_1. If none of the chips CHIP_1-CHIP_N is activated, the memory controller 410 outputs a disable code "000" to the first ID code generator 310_1 to serve as the first seed code SC_1. Therefore, in the present embodiment, chip selection through the "distinct ID code" is achieved.

FIG. 6 is a truth table of activating each of the stacked layers when seven layers of memory chips of FIG. 4 are stacked. For example, when the first seed code SC_1 output by the memory controller 410 is "111", the memory chip CHIP_1 is activated. When the first seed code SC_1 is "100", the memory chip CHIP_5 is activated, and the others are deduced by analogy. When none of the memory chips is activated, the first seed code SC_1 is "000", as that shown in a last column of FIG. 6. The other ID information corresponding to the activated memory chips CHIP_1-CHIP_N can be obtained according to the truth table of FIG. 6. For example, when the memory controller 410 activates the memory chip CHIP_1 by outputting the first seed code SC_1 of "111", the ID information of the other memory chips CHIP_2-CHIP_7 corresponding to the activated memory chip CHIP_1 are the ID codes ID_2-ID_7 of "011", "001", "100", "010", "101" and "110". For example, when the chip CHIP_5 receives the ID code ID_5 of "010", the memory chip CHIP_1 is activated, so that the memory chip CHIP_5 takes "010" as "the other ID information corresponding to the activated memory chip CHIP_1". Therefore, when one set of the redundant repair element of the memory chip CHIP_5 is used to repair the faulty memory element of the memory chip CHIP_1, the value stored to the chip ID field of the redundant repair element is "010", and the faulty memory element of the memory chip CHIP_1 can be repaired.

Figure 7:
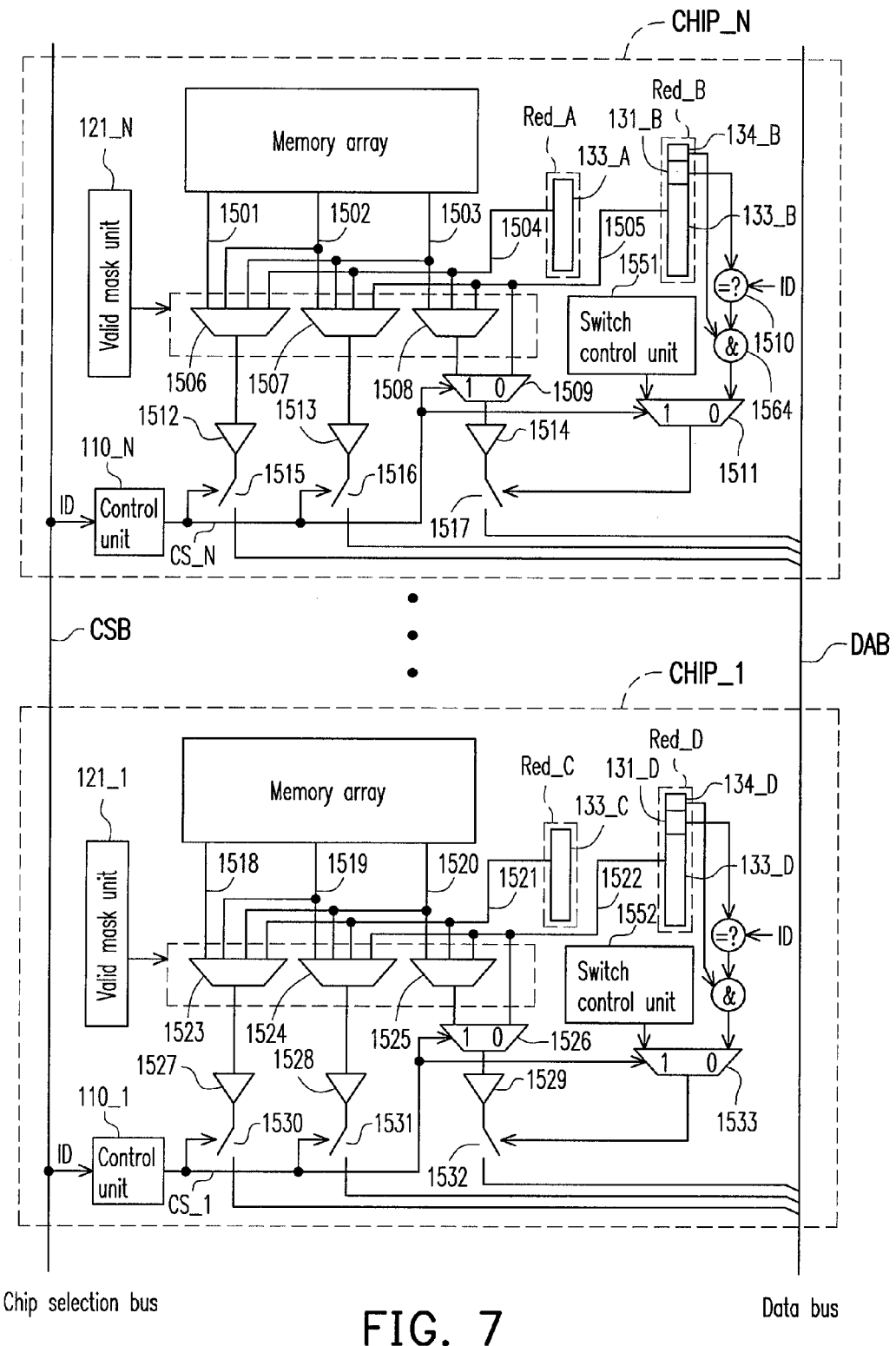
FIG. 7 is a block schematic diagram of a part of bits of a memory array of FIG. 1A according to another embodiment of the disclosure.

FIG. 7 is a block schematic diagram of repairing a part of bits of the memory array of FIG. 1A according to another embodiment of the disclosure, which is a memory column repair mechanism. In the present embodiment, only last three bit-lines and two redundant column repair elements Red_A and Red_B are demonstrated, which can be used for repairing at most two faulty columns in the same layer and at most one faulty column in another layer, those skilled in the art can redesign the repair mechanism for repairing more faulty bit-lines according to the schematic diagram of the present embodiment. Descriptions of the other memory chips (for example, the memory chip CHIP_1) can refer to the related descriptions of the memory chip CHIP_N.

Referring to FIG. 1A and FIG. 7, the repairable multi-layer memory chip stack comprising a plurality of memory chips (e.g. CHIP_1-CHIP_N). The memory chips CHIP_1-CHIP_N are coupled to an address bus ADB and a data bus DAB. Each of the memory chips comprise a control unit, a decoding unit, a memory array, at least one switch control unit, a redundant repair unit, a valid mask unit and a plurality of multiplexers. For example, the memory chip CHIP_N includes a control unit 110_N, a decoding unit 150_N, a memory array which includes a plurality of bit-lines (for example, bit-line 1501, 1502 and 1503, etc.), a valid mask unit 121_N (which can be used to record the valid state of each column when the memory chip is tested), a plurality of multiplexers (for example, 1506, 1507, 1508, 1509 and 1511 for selecting the output bits, where the multiplexers 1506, 1507, 1508 and 1509 are analog multiplexers, and the multiplexer 1511 is a digital multiplexer), at least one switch control unit 1551 (which is used for generating a logic value "1" or "0" to enable or disable a switch 1517 when the activation signal CSN activates the memory chip CHIP_N according to the repair algorithm), a plurality of sense amplifiers (for example, 1512, 1513 and 1514, which are used for detecting output values of bit lines), a plurality of switches (for example, 1515, 1516 and 1517, which are used for coupling the sense amplifiers to the data bus DAB), and a redundant repair unit 130_N. In this embodiment, the redundant repair unit 130_N includes two redundant column repair elements Red_A and Red_B.

Referring to FIG. 1A and FIG. 7, the control unit 110_N receives an ID code ID to correspondingly generate an activation signal CS_N. The decoding unit 150_N, couples to the address bus ADB for receiving a memory address, and generates a decoded address and a decoded redundant address. A memory array of the memory array module 120_N is coupled to the decoding unit 150_N for receiving the decoded address, wherein bit-lines of the memory array are determined whether to allow the data bus DAB to access data in the bit-lines corresponding the memory address according to the activation signal CS_N and the decoded address. At least one switch control unit (e.g. 1551) determines whether to enable the last bit(s) of the bit-lines (e.g. the bit-line 1503) according to a test result of the memory array of the memory array module 120_N. The redundant repair unit 130_N is coupled to the decoding unit 150_N, wherein the redundant repair unit 130_N comprises at least one set of a redundant repair element (e.g. redundant column repair element Red_A or Red_B), and each set of the redundant repair element comprises a valid field, a chip ID field and a redundant memory. In this embodiment, the redundant repair element Red_B comprises a valid field 134_B, a chip ID field 131_B and a redundant memory 133_B.

The valid mask unit 121_N receives the decoded address, wherein the valid mask unit 121_N determines whether to allow the data bus DAB to access the redundant memory (e.g. the redundant memory 133_A or 133_B) according to the activation signal CS_N and the decoded address. The plurality of multiplexers of FIG. 7 receive at least a selection signal from the valid mask unit 121_N to determine which bit-lines can be connected to the data bus DAB. Wherein, the redundant memory of one set of redundant repair elements (e.g. the redundant memory 133_B) in the redundant repair unit 130_N is coupled to the data bus DAB when value of the valid field of the redundant repair element (e.g. the valid field 134_B of the redundant repair element Red_B) is a valid state, and value of the chip ID field of the redundant repair element (e.g. the chip ID field 131_B of the redundant repair element Red_B) matches the ID code.

The logic value ("1" or "0") generated by the switch control unit 1551 can be built in the switch control unit 1551 during repairing the memory array of the memory chip CHIP_N. In some embodiment, a fuse circuit can be the switch control unit 1551, so as to program the fuse circuit to generate the logic value ("1" or "0"). The switch control unit 1551 can be programmed for generating a logic value "1" if number of redundant column repair elements of the memory chip CHIP_N (e.g. Red_A and Red_B) is enough for repairing all of the faulty columns of the memory array in the same layer (i.e. the memory chip CHIP_N). The switch control unit 1551 can be programmed for generating a logic value "0" if number of redundant column repair elements of the memory chip CHIP_N (e.g. Red_A and Red_B) is not enough for repairing all of the faulty columns of the memory array in the same layer (i.e. the memory chip CHIP_N).

The redundant column repair element Red_A is only used for repairing a faulty column in the same layer, and the repaired columns thereof are switched to a correct column address through the multiplexers, so that there is not necessary to implement the chip ID field 131, the faulty address field 132 and the valid field 134, and only the redundant column memory 133_A needs to be implemented. The redundant column repair element Red_B is used for both repairing the faulty column in the same layer and another one in the other layer, and the cross-layer repaired column is only limited to be the last column (i.e. the decoded address permanently couples to the last column), so that there is not necessary to implement the faulty address field 132, and only the valid field 134_B, the chip ID field 131_B and the redundant column memory 133_B need to be implemented.

Similarly, the memory chip CHIP_1 includes a plurality of bit-lines 1518, 1519 and 1520, a valid mask unit 121_1, a plurality of multiplexers (for example, 1523, 1524, 1525, 1526 and 1533 for selecting the output bits, where the multiplexers 1523, 1524, 1525 and 1526 are analog multiplexers, and the multiplexer 1533 is a digital multiplexer), an switch control unit 1552, a plurality of sense amplifiers (for example, 1527, 1528 and 1529, which are used for detecting output values of bit-lines), a plurality of switches (for example, 1530, 1531 and 1532, which are used for coupling the sense amplifiers to the data bus DAB), and two redundant repair elements Red_C and Red_D.

The logic value ("1" or "0") can be built in the switch control unit 1552 during repairing the memory array of the memory chip CHIP_1. In some embodiment, a fuse circuit can be the switch control unit 1552, so as to program the fuse circuit to generate the logic value ("1" or "0"). The switch control unit 1552 can be programmed for generating a logic value "1" if number of redundant column repair elements of the memory chip CHIP_1 (e.g. Red_C and Red_D) is enough for repairing all of the faulty columns of the memory array in the same layer (i.e. the memory chip CHIP_1). The switch control unit 1552 can be programmed for generating a logic value "0" if number of redundant column repair elements of the memory chip CHIP_1 (e.g. Red_C and Red_D) is not enough for repairing all of the faulty columns of the memory array in the same layer (i.e. the memory chip CHIP_1).

The redundant column repair element Red_C is only used for repairing a faulty column in the same layer, and the repaired columns thereof are switched to a correct column address through the multiplexers, so that only the redundant column memory 133_C needs to be implemented. The redundant column repair element Red_D is used for both repairing the faulty column in the same layer and another one in the other layer, and the cross-layer repaired column is also only limited to be the last column (i.e. the decoded address permanently couples to the last column), so that only a valid field 134_D, a chip ID field 131_D and a redundant column memory 133_D need to be implemented.

In case that all of the bits corresponding to the decoded column address output by the decoding unit 150_N are good, the column valid state stored to the valid mask unit 121_N when the memory chip is tested is set to valid (or enabled), and the memory array module 120_N can control the multiplexer 1506 to select to output the value of bit-line 1501, control the multiplexer 1507 to select to output the value of bit-line 1502, and control the multiplexer 1508 to select to output the value of bit-line 1503. Since all of the columns are good and no need to be repaired, the logic value of the switch control unit 1551 is set to "1". The memory controller can provide the ID code ID to the control unit 110_N through the chip selection bus CSB to enable the memory array module 120_N. For example, the memory controller enables the switches 1515 and 1516 through the control unit 110_N. Regarding the switch 1517, since the activation signal CS_N output by the control unit 110_N is true, the multiplexer 1511 outputs the logic value of the switch control unit 1551 which is set to "1" to the control input of the switch 1517, so that the switch 1517 is also enabled to output the value which is output by the multiplexer 1509. Moreover, the activation signal CS_N with the logic value of "true" also controls the multiplexer 1509, so that the output of the multiplexer 1508 is coupled to the sense amplifier 1514. Therefore, the memory controller can access the data of the bit-lines 1501, 1502 and 1503 through the data bus DAB and the sense amplifiers 1512, 1513 and 1514.

In the present embodiment, the redundant column memories 133_A and 133_B of the redundant column repair elements Red_A and Red_B respectively have bit-lines 1504 and 1505 to output. In case that only one column which corresponding to the bit-line 1502 in the memory array is faulty, the memory array module 120_N controls the multiplexer 1506 to select the output of the bit-line 1501, controls the multiplexer 1507 to select the output of the bit-line 1503, and controls the multiplexer 1508 to select the output of the bit-line 1504 according to the values stored in the valid mask unit 121_N. Therefore, the bit-line 1503 and the bit-line 1504 of the redundant column memory 133_A in the redundant column repair element Red_A sequentially shift their output to replace the faulty bit caused by the faulty bit-line 1502 in the memory array module 120_N for repairing the faulty column. When the memory controller outputs the ID code ID to the control unit 110_N through the chip selection bus CSB to enable the memory array module 120_N, the memory controller can access the data of the bit-lines 1501, 1503 and 1504 through the data bus DAB and the sense amplifiers 1512, 1513 and 1514.

Similarly, in case that two bit-lines 1518 and 1520 are faulty in the memory chip CHIP_1, the memory array module 120_1 controls the multiplexer 1523 to select the output of the bit-line 1519, controls the multiplexer 1524 to select the output of the bit-line 1521, and controls the multiplexer 1525 to select the output of the bit-line 1522 according to the values stored in the valid mask unit 121_1. The bit-lines 1521 and 1522 are the bit-lines of the redundant column repair elements Red_C and Red_D. Therefore, the redundant column repair elements can repair the faulty bit-lines 1518 and 1520 in the memory array module 120_1 through the bit-lines 1521 and 1522. In this case, the two redundant column repair elements are used for repairing two faulty bit-lines in the same layer without enabling the cross-layer repair circuitry, the switch control unit 1552 is set to "1". The memory controller can output the ID code ID to the control unit 110_1 through the chip selection bus CSB to enable the memory array module 120_1. For example, the memory controller enables the switches 1530 and 1531 through the control unit 110_1. Regarding the switch 1532, since the activation signal CS_1 output by the control unit 110_1 is true, the multiplexer 1533 outputs the logic value of the switch control unit 1552 which is set to "1" to the control input of the switch 1532, so that the switch 1532 is also enabled. Moreover, the activation signal CS_1 with the logic value of "1" also controls the multiplexer 1526, so that the output of the multiplexer 1525 is coupled to the sense amplifier 1529. Therefore, when the memory controller provides the ID code ID to the control unit 110_1 through the chip selection bus CSB to enable the memory array module 120_1, the memory controller can access the data of the bit-lines 1519, 1521 and 1522 through the valid mask unit 121_1, the data bus DAB and the sense amplifiers 1527, 1528 and 1529.

In case that the three bit-lines 1518, 1519 and 1520 are all faulty, the memory array module 120_1 controls the multiplexer 1523 to select the output of the bit-line 1521, controls the multiplexer 1524 to select the output of the bit-line 1522, and controls the multiplexer 1525 to disable (i.e. not to select any bit-line) according to the value stored in the valid mask unit 121_1. However, the two redundant column repair elements Red_C and Red_D of the memory chip CHIP_1 can only repair two of the three bits through the bit lines 1521 and 1522, so that the redundant column repair element of another layer is required for repairing the remained faulty bit-line. Therefore, the switch control unit 1552 is set to "0" to disable the output of the last bit-line, so as to enable the redundant column repair element of the other layer to replace the last bit-line of the memory array 120_1 in the chip CHIP_1. In the present embodiment, the redundant column repair element Red_B of the memory chip CHIP_N can repair the faulty memory element of the memory chip CHIP_1 through the bit-line 1505. Referring to FIG. 7, the ID code ID (or other ID information corresponding to the activated memory chip CHIP_1) of the memory chip CHIP_1 can be stored to the chip ID field 131_B of the redundant column repair element Red_B of the memory chip CHIP_N, and the valid field 134_B of the redundant column repair element Red_B is set to a valid state "1". When the memory controller outputs the ID code ID to the control unit 110_1 through the chip selection bus CSB to enable the memory array module 120_1, a comparator 1510 in the memory chip CHIP_N compares the ID code ID of the chip selection bus CSB and the value of the chip ID field 131_B. Since the ID code ID of the chip selection bus CSB matches the value of the chip ID field 131_B, the output value of the comparator 1510 is set to "1", and the valid field 134_B of the redundant column repair element Red_B is valid (i.e. the value of the valid field 134_B is "1"), and the output value of an AND gate 1564 is 1. Only when the output value of the AND gate 1564 is 1, the value of the corresponding redundant memory 133_B can be output to the corresponding bit-line 1505. Meanwhile, the control unit 110_N outputs a logic value "0", and the multiplexer 1511 is set to select the output of the AND gate 1564 as the output value of the multiplexer 1511 which is couple to the control input of the switch 1517. Since the output value of the AND gate 1564 is "1", the switch 1517 is enabled. Since the control unit 110_N outputs the logic value "0", the multiplexer 1509 couples the redundant memory 133_B of the redundant column repair element Red_B to the input of the sense amplifier 1514 through the bit-line 1505. Therefore, when the memory controller outputs the ID code ID to the control unit 110_1 through the chip selection bus CSB to enable the memory array module 120_1 of the memory chip CHIP_1, the memory controller can access the data of the bit-lines 1521, 1522 and 1505 through the valid mask unit 121_1, the valid mask unit 121_N, the chip ID field 131_B, the data bus DAB and the sense amplifiers 1527, 1528 and 1514. Therefore, the redundant column repair element Red_B of the memory chip CHIP_N can repair the last faulty column of the memory chip CHIP_1 through the bit-line 1505 with the cross-layer scheme.

It should be noticed that when the redundant column repair element Red_B of the memory chip CHIP_N is used to repair the faulty memory element of the memory chip CHIP_1, the multiplexer 1533 of the memory chip CHIP_1 outputs the logic value "0" of the switch control unit 1552 to disable the switch 1532. Therefore, when the redundant column repair element Red_B is used for repairing the faulty memory element of the memory chip CHIP_1, the sense amplifier 1529 is disabled and there is no bus contention between the outputs of the sense amplifiers 1514 and 1529.

Figure 8:
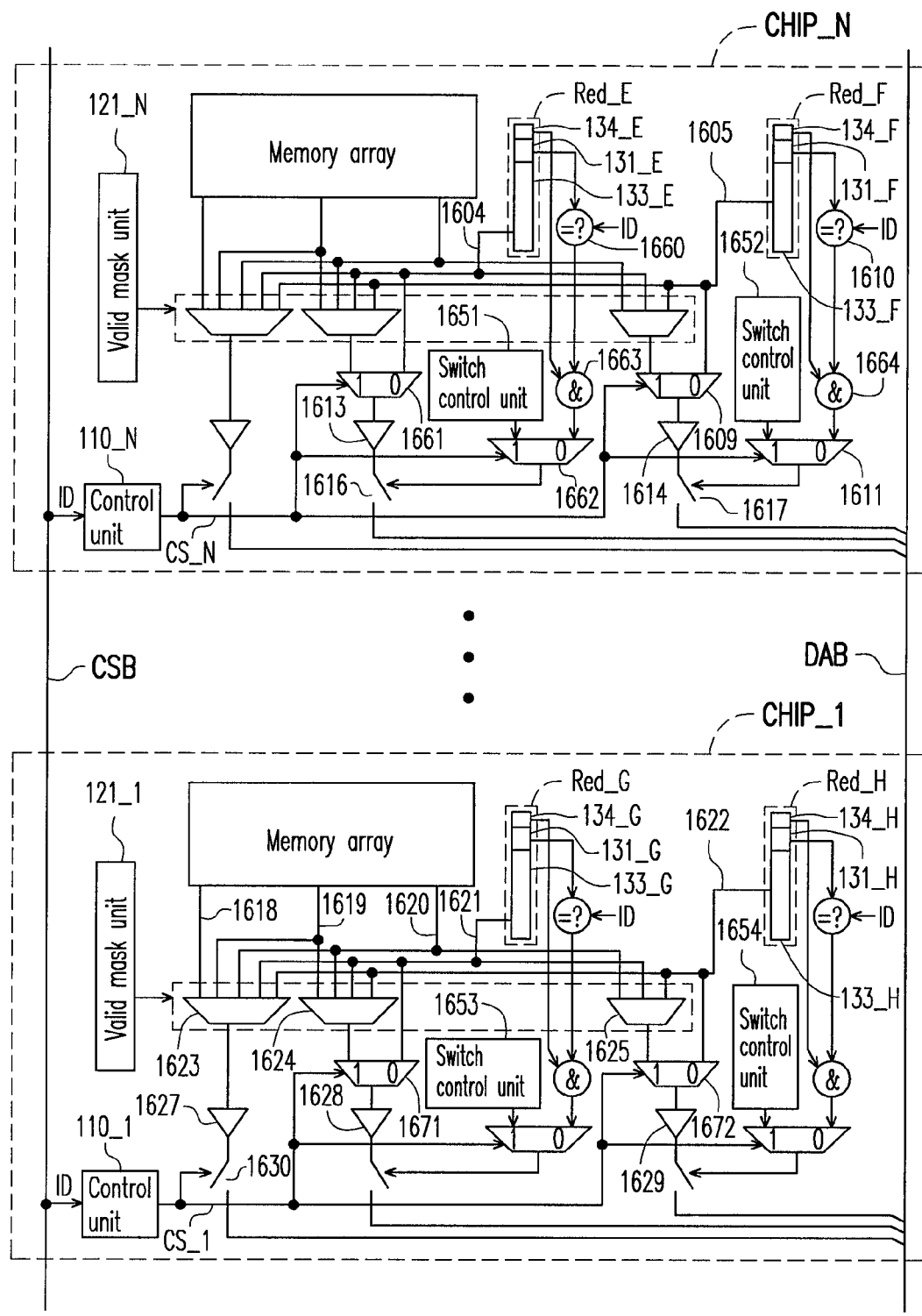
FIG. 8 is a block schematic diagram of a part of bits of a memory array of FIG. 1A according to another embodiment of the disclosure.

FIG. 8 is a block schematic diagram of repairing a part of columns of the memory array of FIG. 1A according to another embodiment of the disclosure. In the present embodiment, only final three bit-lines and two redundant column repair elements Red_E and Red_F are demonstrated, which can be used for repairing at most two bit-lines in the same layer and at most two bits in the other layers, where when the redundant column repair element Red_E is used for repairing the faulty column in another layer, it can only repair the one of the last two bit-lines of the other layers, and when the redundant column repair element Red_F is used for repairing the faulty column in the other layers, it can only repair the last bit-line in the other layer. The repairing methods used in case that all of the columns of the chip CHIP_N are good or only one or two bit-lines of the chip CHIP_N are faulty can refer to the related descriptions of FIG. 7, and since it is unnecessary to repair the faulty column through the cross-layer repair mechanism, values of switch control units 1651 and 1652 are all set to 1.

Referring to FIG. 1A and FIG. 8, in case that three bit-lines 1618, 1619 and 1620 are all faulty, the memory array module 120_1 controls an multiplexer 1623 to select the output of a bit-line 1621, controls an multiplexer 1624 to select the output of a bit-line 1622, and disables an multiplexer 1625 (i.e. not to select any bit-line) according to the values stored in the valid mask unit 121_1. Since the penultimate bit-line of the memory chip CHIP_1 can be repaired by the bit-line 1622 of the same layer, a switch control unit 1653 has to be set to "1", and the last bit-line has to be repaired by the redundant column repair element of the other layers, so that another switch control unit 1654 is set to "0" to disable the output of the last bit-line, so as to enable the redundant column repair element of another layer to repair the last bit-line. In the present embodiment, the redundant column repair element Red_F of the memory chip CHIP_N is used to repair the faulty memory element of the memory chip CHIP_1.

Referring to FIG. 1A and FIG. 8, the ID code ID (or other ID information corresponding to the activated memory chip CHIP_1) of the memory chip CHIP_1 can be stored in a chip ID field 131_F of the redundant column repair element Red_F of the memory chip CHIP_N, and a valid field 134_F of the redundant column repair element Red_F is set to valid (i.e. a logic value "1"). When the memory controller outputs the ID code ID through the chip selection bus CSB to enable the memory chip CHIP_1, the activation signal CS_1 output by the control unit 110_1 is set to the logic value "1". Therefore, a switch 1630 is enabled, a multiplexer 1671 selects to couple the output of the multiplexer 1624 to a sense amplifier 1628, and a multiplexer 1672 selects to couple the output of the multiplexer 1625 which is disabled to a sense amplifier 1629. When the memory controller outputs the ID code ID to the control unit 110_1 through the chip selection bus CSB to enable the memory array module 120_1, a comparator 1610 in the memory chip CHIP_N compares the ID code ID of the chip selection bus CSB and the value of the chip ID field 131_F. Since the ID code ID of the chip selection bus CSB matches the value of the chip ID field 131_F, the output value of the comparator 1610 is set to "1", and the valid field 134_F of the redundant column repair element Red_F is set to valid (i.e. the logic value "1"), and the output logic value of an AND gate 1664 is "1". Meanwhile, the control unit 110_N outputs a logic value "0", and the output of the multiplexer 1611 is coupled to the output (which is the logic value "1") of the AND gate 1664 and enables the switch 1617. Since the control unit 110_N outputs the logic value "0", the multiplexer 1609 couples the redundant memory 133_F of the redundant column repair element Red_F to the input of the sense amplifier 1614 through the bit-line 1605. Therefore, when the memory controller outputs the ID code ID to the control unit 110_1 through the chip selection bus CSB to enable the memory array module 120_1, the memory controller can access the data of the bit-lines 1621, 1622 and 1605 through the valid mask unit 121_1, the data bus DAB and the sense amplifiers 1627, 1628 and 1614. Therefore, the redundant column repair element Red_F of the memory chip CHIP_N can be used for repairing the last faulty column of the memory chip CHIP_1 through the bit line 1605 with the cross-layer repair scheme.

Deduced by analogy, in case that four bit-lines of the memory chip CHIP_1 are faulty, the memory array module 120_1 controls the multiplexer 1623 to select the output of the bit-line 1622, disables the multiplexer 1624 and the multiplexer 1625 off according to the values stored in the valid mask unit 121_1. Since the last two bit-lines of the memory chip CHIP_1 cannot be repaired by the redundant column repair element of the same layer, the switch control units 1653 and 1654 are all set to "0" to disable the output of the last two bit-lines, so as to use the redundant column repair element of the other layer(s) to repair the two last bit-lines. In the present embodiment, the redundant column repair elements Red_E and Red_F of the memory chip CHIP_N are used to repair the two faulty bit-lines of the memory chip CHIP_1 through the bit-lines 1604 and 1605.

Referring to FIG. 1A and FIG. 8, the ID code ID (or other ID information corresponding to the activated memory chip CHIP_1) of the memory chip CHIP_1 can be recorded in the chip ID fields 131_E and 131_F of the redundant column repair elements Red_E and Red_F of the memory chip CHIP_N, and the valid fields 131_E and 134_F of the redundant column repair elements are all set to valid. When the memory controller outputs the ID code ID to the control unit 110_1 through the chip selection bus CSB to enable the memory array module 120_1, comparators 1660 and 1610 in the memory chip CHIP_N respectively compare the value of the chip ID field 131_E and the chip ID field 131_F with the ID code ID of the chip selection bus CSB. Since the ID code ID of the chip selection bus CSB matches both of the values of the chip ID field 131_E and the chip ID field 131_F, the output values of the comparators 1660 and 1610 are all set to "1", and the values of the valid fields 131_E and 134_F of the redundant column repair element Red_E and Red_F are all set to valid, so that the output values of an AND gate 1663 and the AND gate 1664 are all set to "1". Only when the output value of the AND gate 1663 is 1, the value of the corresponding redundant memory 133_E can be output to the corresponding bit-line 1604. Similarly, only when the output value of the AND gate 1664 is 1, the value of the corresponding redundant memory 133_F can be output to the corresponding bit-line 1605. Meanwhile, the control unit 110_N outputs a logic value "0", and the outputs of multiplexers 1662 and 1611 are respectively coupled to the outputs (which values are set to "1") of the AND gates 1663 and 1664, and the switches 1616 and 1617 are enabled. Since the control unit 110_N outputs the logic value "0", analog multiplexers 1661 and 1609 couple the redundant memories 133_E and 133F of the redundant column repair elements Red_E and Red_F to the inputs of the sense amplifiers 1613 and 1614 through the bit-lines 1604 and 1605. Therefore, when the memory controller outputs the ID code ID to the control unit 110_1 through the chip selection bus CSB to enable the memory array module 120_1, the memory controller can access data of the bit-lines 1622, 1604 and 1605 through the valid mask unit 121_1, the data bus DAB and the sense amplifiers 1627, 1613 and 1614. Therefore, the redundant column repair elements Red_E and Red_F of the memory chip CHIP_N can repair the last two faulty bit-lines of the memory chip CHIP_1 through the bit-lines 1604 and 1605 with the cross-layer repair scheme.

In summary, when the memory test is performed, a redundant analysis algorithm is used to find an optimal repair solution. For example, when the chip stack allows a multi-column cross-layer repair mechanism, relatively high hardware cost is required. Therefore, in order to reduce the manufacturing cost, at most one column is allowed to be repaired with the cross-layer repair scheme, and under such hardware limitation, when the faulty memory element is found, according to the algorithm, the redundant column repair elements (for example, the redundant column repair elements Red_A and Red_B of FIG. 7) of the same layer are used in priority to repair the faulty memory element, and a redundant row repair element is reserved to implement the cross-layer repair. When the other layer requires an unused redundant row of a certain layer, a programmable address (i.e. the chip ID field 131 and the faulty address field 132) of the redundant row is set to a repair address and ID code of the faulty layer (or the other ID information of the layer). Regarding the faulty row, a programmable valid mask unit can be used to indicate whether such row is faulty. When the address points to the faulty row, since the indicator is "faulty", the memory circuit disables the output of the faulty row and disconnects the faulty layer and the data bus DAB, so as to avoid bus contention with the redundant row in the other layer.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A repairable multi-layer memory chip stack, comprising:
   a plurality of memory chips, coupled to an address bus and a data bus, and each of the memory chips comprising:
   a control unit, receiving an identification (ID) code to correspondingly generate an activation signal;
   a decoding unit, coupled to the address bus for receiving a memory address, and generating a decoded address and a decoded redundant address;
   a memory array module, coupled to the decoding unit for receiving the decoded address, and coupled to the control unit for receiving the activation signal, wherein the memory array module determines whether to allow the data bus to access data in the memory array module corresponding the memory address according to the activation signal and the decoded address; and
   a redundant repair unit, coupled to the decoding unit, wherein the redundant repair unit comprises at least one set of a redundant repair element, and each set of the redundant repair element comprises a valid field, a chip ID field, a faulty address field and a redundant memory, the redundant memory of one set of redundant repair elements in the redundant repair unit is coupled to the data bus when value of the valid field of the redundant repair element is a valid state, value of the chip ID field of the redundant repair element matches the ID code, and value of the faulty address field of the redundant repair element matches the memory address.

2. The repairable multi-layer memory chip stack as claimed in claim 1, wherein the memory array module comprises:
   a memory array, coupled to the decoding unit;
   a valid mask unit, coupled to the decoding unit for receiving the decoded address to correspondingly generate a valid mask signal;
   a logic circuit, having a first input terminal coupled to the control unit for receiving the activation signal, and a second input terminal coupled to the valid mask unit for receiving the valid mask signal, wherein an output signal of the logic circuit is transmitted to the memory array to control an activation state of the memory array; and
   a switch circuit, coupled between the memory array and the data bus, wherein when the output signal of the logic circuit is enabled, the switch circuit is turned on, and otherwise the switch circuit is turned off.

3. The repairable multi-layer memory chip stack as claimed in claim 1, wherein the redundant repair element further comprises:
   a redundant control unit, receiving values of the valid field, the chip ID field and the faulty address field of the corresponding redundant repair element, and determining whether or not to couple the redundant memory of the corresponding redundant repair element to the data bus according to the values.

4. The repairable multi-layer memory chip stack as claimed in claim 3, wherein the redundant control unit comprises:
   a first comparator, having a first input terminal receiving the ID code, and a second input terminal coupled to the chip ID field;
   a second comparator, having a first input terminal receiving the decoded address, and a second input terminal coupled to the faulty address field;
   an AND gate, having a first input terminal coupled to an output terminal of the first comparator, a second input terminal coupled to an output terminal of the second comparator, and a third input terminal coupled to the valid field; and
   a switch circuit, having a first terminal and a second terminal respectively coupled to the redundant memory and the data bus, and a control terminal coupled to an output terminal of the AND gate.

5. The repairable multi-layer memory chip stack as claimed in claim 1, wherein the control units of the memory chips are coupled to a chip selection bus for receiving the ID code, the control units are respectively inbuilt with activation codes different to each other, and when the ID code matches the activation code built in the control unit of an $i^{th}$ memory chip of the memory chips, the control unit of the $i^{th}$ memory chip activates the memory array module of the $i^{th}$ memory chip.

6. The repairable multi-layer memory chip stack as claimed in claim 1, wherein a number of the memory chips is N, and the multi-layer memory chip stack further comprises:
   N ID code generators, wherein an $i^{th}$ ID code generator is disposed in an $i^{th}$ memory chip of the memory chips, and i is an integer from 1 to N, wherein a first ID code generator of the ID code generators receives a first seed code, and correspondingly generates a first ID code and a second seed code according to the first seed code, the $i^{th}$ ID code generator is electrically connected to an $(i-1)^{th}$ ID code generator for receiving an $i^{th}$ seed code and correspondingly generating an $i^{th}$ ID code and an $(i+1)^{th}$ seed code, wherein the first ID code to the $N^{th}$ ID code are different,
   wherein the control unit of the $i^{th}$ memory chip of the memory chips is coupled to the $i^{th}$ ID code generator for receiving the $i^{th}$ ID code to serve as the ID code, the control units are respectively inbuilt with a same activation code, and when the $i^{th}$ ID code received by the control unit of the $i^{th}$ memory chip of the memory chips matches the activation code, the control unit of the $i^{th}$ memory chip activates the memory array module of the $i^{th}$ memory chip.

7. The repairable multi-layer memory chip stack as claimed in claim 6, wherein the ID code generators are cyclic code generators.

8. The repairable multi-layer memory chip stack as claimed in claim 1, wherein the value of the faulty address field comprises a column address.

9. The repairable multi-layer memory chip stack as claimed in claim 1, wherein the value of the faulty address field comprises a row address.

10. The repairable multi-layer memory chip stack as claimed in claim 5, wherein each of the control units of the memory chips is respectively inbuilt with an activation codes, and the activation code of each memory chip is a unique value.

11. The repairable multi-layer memory chip stack as claimed in claim 6, wherein each of the control units of the memory chips is respectively inbuilt with an activation codes, and the activation code of each memory chip is a same value.

12. A method for repairing a multi-layer memory chip stack, comprising:

configuring a redundant repair unit in a memory chip, wherein the redundant repair unit comprises at least one set of a redundant repair element, and each set of the redundant repair element comprises a valid field, a chip ID field, a faulty address field and a redundant memory;

decoding a memory address on an address bus to generate a decoded address and a decoded redundant address;

enabling a data access port of a memory array module of the memory chip such that a data bus accesses the memory array module through the data access port when an ID code is verified to be correct and corresponding memory element of the decoded address is fault free; and enabling the redundant memory of the redundant repair element such that the data bus is capable of accessing the redundant memory if value of the valid field of one set of the redundant repair element in the redundant repair unit is a valid state, the ID code matches value of the chip ID field of the redundant repair element, and the memory address matches value of the faulty address field of the redundant repair element.

13. The method for repairing the multi-layer memory chip stack as claimed in claim 12, further comprising:
    disabling the memory array module when the ID code is verified to be incorrect; and
    disabling the data access port of the memory array module when the decoded address is invalid.

14. The method for repairing the multi-layer memory chip stack as claimed in claim 12, further comprising:
    disabling the redundant memory when the ID code is not matched to the value of the chip ID field; and
    disabling the redundant memory when the decoded redundant address is not matched to the value of the faulty address field.

15. The method for repairing the multi-layer memory chip stack as claimed in claim 12, wherein the ID code is verified with an activation code, the activation code is inbuilt in the memory chip, and the activation code of each memory chip is a unique value.

16. The method for repairing the multi-layer memory chip stack as claimed in claim 12, wherein the ID code is verified with an activation code, the activation code is inbuilt in the memory chip, and the activation code of each memory chip is a same value.

17. A repairable multi-layer memory chip stack, comprising:
    a plurality of memory chips, coupled to an address bus and a data bus, and each of the memory chips comprising:
        a control unit, receiving an identification (ID) code to correspondingly generate an activation signal;
        a decoding unit, coupled to the address bus for receiving a memory address, and generating a decoded address and a decoded redundant address;
        a memory array, coupled to the decoding unit for receiving the decoded address, wherein bit-lines of the memory array are determined whether to allow the data bus to access data in the bit-lines corresponding the memory address according to the activation signal and the decoded address;
        at least one switch control unit for determining whether to enable the last bit(s) of the bit-lines according to a test result of the memory array;
        a redundant repair unit, coupled to the decoding unit, wherein the redundant repair unit comprises at least one set of a redundant repair element, and each set of the redundant repair element comprises a valid field, a chip ID field and a redundant memory;
        a valid mask unit for receiving the decoded address, wherein the valid mask unit determines whether to allow the data bus to access the redundant memory according to the activation signal and the decoded address; and
        a plurality of multiplexers for receiving at least a selection signal from the valid mask unit to determine which bit-lines can be connected to the data bus;
    wherein the redundant memory of one set of redundant repair elements in the redundant repair unit is coupled to the data bus when value of the valid field of the redundant repair element is a valid state, and value of the chip ID field of the redundant repair element matches the ID code.

* * * * *